(12) United States Patent
Mandelman et al.

(10) Patent No.: US 6,455,886 B1
(45) Date of Patent: Sep. 24, 2002

(54) STRUCTURE AND PROCESS FOR COMPACT CELL AREA IN A STACKED CAPACITOR CELL ARRAY

(75) Inventors: Jack A. Mandelman, Stormville, NY (US); Ramachandra Divakaruni, Somers, NY (US); Carl J. Radens, LaGrangeville, NY (US)

(73) Assignee: International Business Machines Corporation, Armonk, NY (US)

( * ) Notice: Subject to any disclaimer, the term of this patent is extended or adjusted under 35 U.S.C. 154(b) by 13 days.

(21) Appl. No.: 09/636,564

(22) Filed: Aug. 10, 2000

(51) Int. Cl.⁷ .................. H01L 27/108; H01L 29/76; H01L 29/94; H01L 31/119
(52) U.S. Cl. .................. 257/301; 257/302
(58) Field of Search .................. 257/295–310; 438/241–254, 396–398

(56) References Cited

U.S. PATENT DOCUMENTS

| | | | |
|---|---|---|---|
| 4,970,564 A | | 11/1990 | Kimura et al. |
| 5,332,923 A | * | 7/1994 | Takeuchi .................. 257/296 |
| 5,497,017 A | * | 3/1996 | Gonzales .................. 257/306 |
| 5,504,357 A | | 4/1996 | Kim et al. |
| 5,600,162 A | | 2/1997 | Kösner |
| 5,650,346 A | | 7/1997 | Pan et al. |
| 5,714,401 A | | 2/1998 | Kim et al. |
| 5,783,462 A | | 7/1998 | Huang |
| 5,828,094 A | | 10/1998 | Lee |
| 5,909,618 A | | 6/1999 | Forbes et al. |
| 5,929,477 A | | 7/1999 | McAllister Burns, Jr. et al. |

OTHER PUBLICATIONS

US 5,841,697, 11/1998, Van Houdt et al. (withdrawn)

* cited by examiner

Primary Examiner—Tom Thomas
Assistant Examiner—Cuong Quang Nguyen
(74) Attorney, Agent, or Firm—Steven Capella

(57) ABSTRACT

A method for forming, and a structure for a semiconductor device having vertically-oriented transistors connected to stacked capacitor cells, wherein a contact area for the capacitors enables a compact cell. A vertically-oriented transistor is formed in a trough in a substrate above a buried bit line. The gate conductor may be formed in the trough above the buried bit line, with source and drain diffusions spaced along a sidewall of the trough. Isolation regions are formed in the semiconductor substrate to isolate the transistors. Word lines are formed above the surface of the semiconductor substrate in a direction perpendicular to the direction of the buried bit lines. A capacitor contact is formed above the surface of the semiconductor substrate at a contact area of an active region between adjacent word lines. The active region is rhomboid in shape, enabling a low capacitor contact resistance, a small bit line and word line pitch, and consequently, a compact capacitor cell.

5 Claims, 28 Drawing Sheets

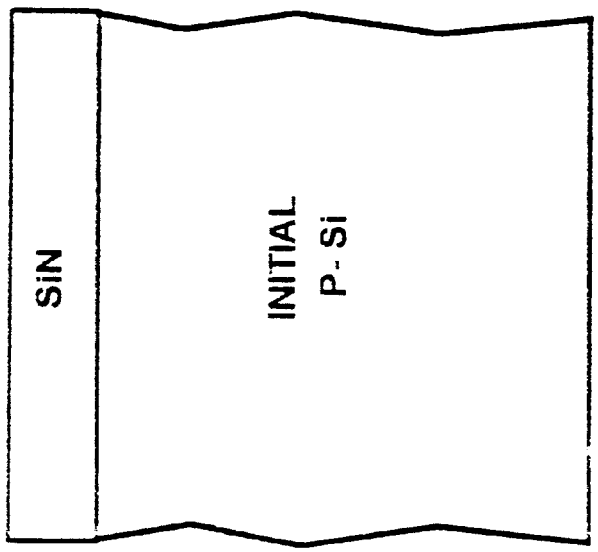
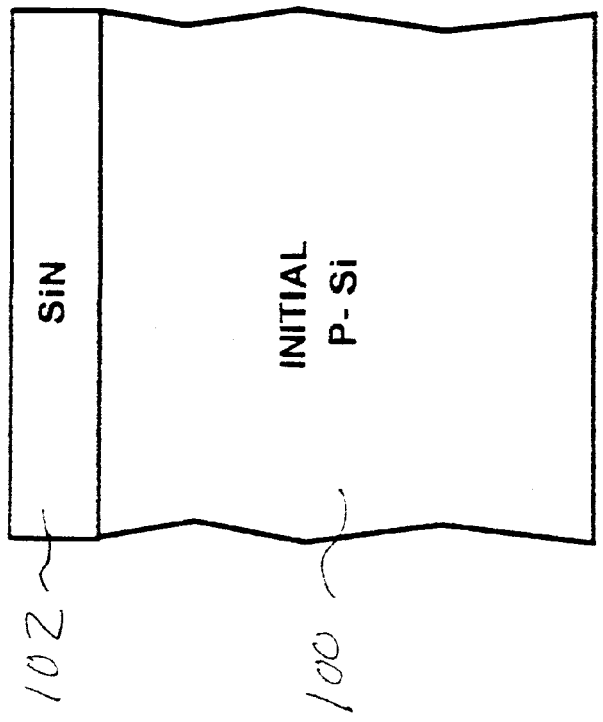
FIG. 1

STRUCTURE AND PROCESS FOR COMPACT CELL AREA IN A STACKED CAPACITOR CELL ARRAY

CROSS REFERENCE TO RELATED APPLICATIONS

This application is related by common inventorship and subject matter to co-pending applications "Self-Aligned Buried Strap for Vertical Transistors", application Ser. no. 09/329,705; "Buried Bit Line-Shallow Trench Isolation Defined Active Semiconductor Areas", and application Ser. No. 09/597,887 "Structure and Process for 4F² STC Cell Having Vertical MOSFET and Buried Bitline Conductor". The listed applications are fully incorporated herein by this reference.

BACKGROUND OF THE INVENTION

The present invention relates to semiconductor fabrication and more particularly, to a structure and method for obtaining a compact cell area in an array comprising vertical MOSFETs formed over a buried bit line conductor, with stacked capacitors formed above the surface of the silicon.

Present trends in DRAM technology are constantly driving towards reduction in minimum feature size and more compact cell layouts. As a result of the need for ever-increasing array densities, the scalability of contemporary planar MOSFET cells using trough storage capacitors for feature sizes equal to 150 nm and smaller is facing fundamental concerns. The main concern with the scalability of the cell MOSFET is the increased p-well doping concentration needed to meet off-current objectives. It is known in the art that increased array well doping concentration may result in a marked increase in array junction leakage, which degrades retention time. The problems of scalability related to the cell MOSFET, by itself, is driving a paradigm shift towards vertical MOSFET access transistors in the array.

Moreover, the majority of DRAM product utilizes stacked capacitor (STC) DRAM technology. As ground rules (minimum feature sizes) are reduced the amount of capacitance available from deep trough storage capacitors decreases. This is a result of limitations on the scalability of the thickness of the node dielectric, limitations on the etch depth of the deep trough, and because of the reduction of capacitance area that occurs with ground rule reduction (scaling) and more dense cell layouts. RIE (reactive ion etching) lag effect caused by the smaller storage trough openings makes etching adequately deep troughes difficult. Aspect ratios of greater than 50:1, for example, can be entailed, and filling of this extremely high aspect ratio presents major difficulties. Furthermore the higher aspect ratios associated with aggressively scaled deep trough capacitors results in increased series resistance, which, in turn, results in greatly decreased signal development within a given time window. Barring any significant developments regarding higher dielectric constant node insulators and trough fill materials having lower resistivity, it is predicted that trough capacitor storage elements may not be practical beyond the 120 nm generation. Therefore, the long-term (100 nm and beyond) prognosis for the favored DRAM storage element appears to be stacked capacitors. Still, significant improvements concerning the leakage and reliability of high dielectric materials (e.g., barium titanate strontium oxide—BTSO) for STC cells must occur before widespread manufacturing is likely. However, because of the popularity of STC DRAM, extensive industry wide resources are being directed to solve the problems associated with BTSO and other high dielectric materials.

Integration of vertical access MOSFETs and stacked capacitors is a challenging task and has not yet been adopted by the industry. As commonly practiced by DRAM manufacturers, word lines, bit lines and stacked capacitors all reside on or above the silicon surface. An arrangement of such on-or-above-surface cell elements with a vertical access transistor complicates forming the connections with the access transistor and occupies more silicon real estate than deep trough capacitor DRAM cells with vertical access MOSFETs.

To further enhance scalability, the use of vertically oriented channels has been proposed for decoupling the channel length of the cell access MOSFET from the minimum lithographic feature size. Only a limited amount of art exists for STC cells with access transistors having some portion of the channel oriented vertically. Within this limited art, the "U-shaped" channel has been proposed as a means of building the MOSFET beneath the silicon surface. Other cell elements, including the bit lines, are still arranged above the surface. However, the concavity of the "U-shaped" silicon surface with respect to the gate conductor weakens gate control, thereby increasing substrate sensitivity and sub-threshold swing, with accompanying severely decreased available drive current and array performance.

Related art addresses problems associated with increased DRAM density and bit lines arranged above the silicon surface as outlined in the foregoing. Solutions disclosed in the related art include a STC DRAM cell having a bit line buried beneath the surface of the silicon while providing a vertically oriented access transistor. To address problems associated with a Ushaped channel, a channel in the vertically oriented transistor extends in a straight line so that the channel charge carriers flow along a straight-line path from source to drain of the cell access transistor.

However, additional problems associated with STC cells include that cells having an area smaller than 8 F² (where F is a minimum lithographic feature size) are difficult to fabricate because of the requirement to form both a capacitor contact area and a transistor. Methods exist for forming cell areas smaller than 8 F², but these typically entail complications in processing that can add to product costs.

SUMMARY OF THE INVENTION

The present invention improves on structure and method for semiconductor fabrication described in the related art to efficiently fabricate cells having an area substantially less than 8 F². According to the present invention, cell areas substantially less than 8 F² are achieved concurrently with allowing stacked capacitors to be formed above the surface of the silicon, vertically oriented access MOSFETs beneath the silicon surface, and bit line wiring beneath the MOSFETs.

According to an embodiment of the invention, a trough is formed in a semiconductor substrate. A buried bit line is formed in the trough. Preferably, the bit line is completely enclosed by a dielectric liner. A vertical transistor is formed in the substrate above the buried bit line. The gate conductor may be formed in the trough above the buried bit line, with source and drain diffusions spaced along a sidewall of the trough. Isolation regions are formed in the semiconductor substrate to isolate the transistors. Word lines are formed above the surface of the semiconductor substrate in a direction perpendicular to the direction of the buried bit lines. A capacitor contact is formed above the surface of the semiconductor substrate at an area of the active region between adjacent word lines. A stacked capacitor structure may then be formed above the surface of the semiconductor substrate.

In forming the capacitor contact, an active region is formed which is rhomboid in shape when viewed from a plan view. In a preferred embodiment, the rhomboid shape allows a word line pitch substantially equal to 2 F and a bit line pitch substantially equal to 2.5 F in the array, enabling a cell area substantially equal to 5 $F^2$ while still providing enough space for a capacitor contact to be reliably formed in the active region. To form the capacitor contacts, a simple stripe mask may be used. An array cell area of about 5 $F^2$ is thereby enabled in a simplified process as compared to related art.

In a preferred embodiment, the formation of compact, high-density cells as described above may be integrated with the formation of salicided structures in the array support circuitry for improved performance.

BRIEF DESCRIPTION OF THE DRAWINGS

The present invention will now be further described in the following pages of specification when taken in conjunction with the attached drawings, in which:

FIG. 1 is a cross section of a semiconductor substrate;

DETAILED DESCRIPTION OF THE INVENTION

The present invention provides a structure and process for a stacked capacitor cell having a vertical MOSFET and a buried bit line conductor. Using the invention, a DRAM cell area of 5 $F^2$ can be achieved concurrently with stacked capacitors formed above the surface of the silicon for large storage capacitance and low series resistance, vertically oriented access MOSFETs formed beneath the silicon surface to avoid scalability problems, and bit line wiring formed beneath the MOSFETs allowing superior density.

The invention allows for forming high-density DRAM cells in a process that may be integrated with the formation of salicided MOSFETs for high performance in the support circuitry and will be described below in this context. Through saliciding, low resistance source/drain diffusions are formed in the support circuitry. Further, dual work function gate conductors are formed in the support circuitry. Additionally, the invention allows formation of support junctions at a late stage in the process, thereby resulting in shallow junctions and improving scalability and performance. The invention lends itself to embedded DRAM/LOGIC products having minimum lithographic feature sizes of 100 mn and smaller.

Figure 2:
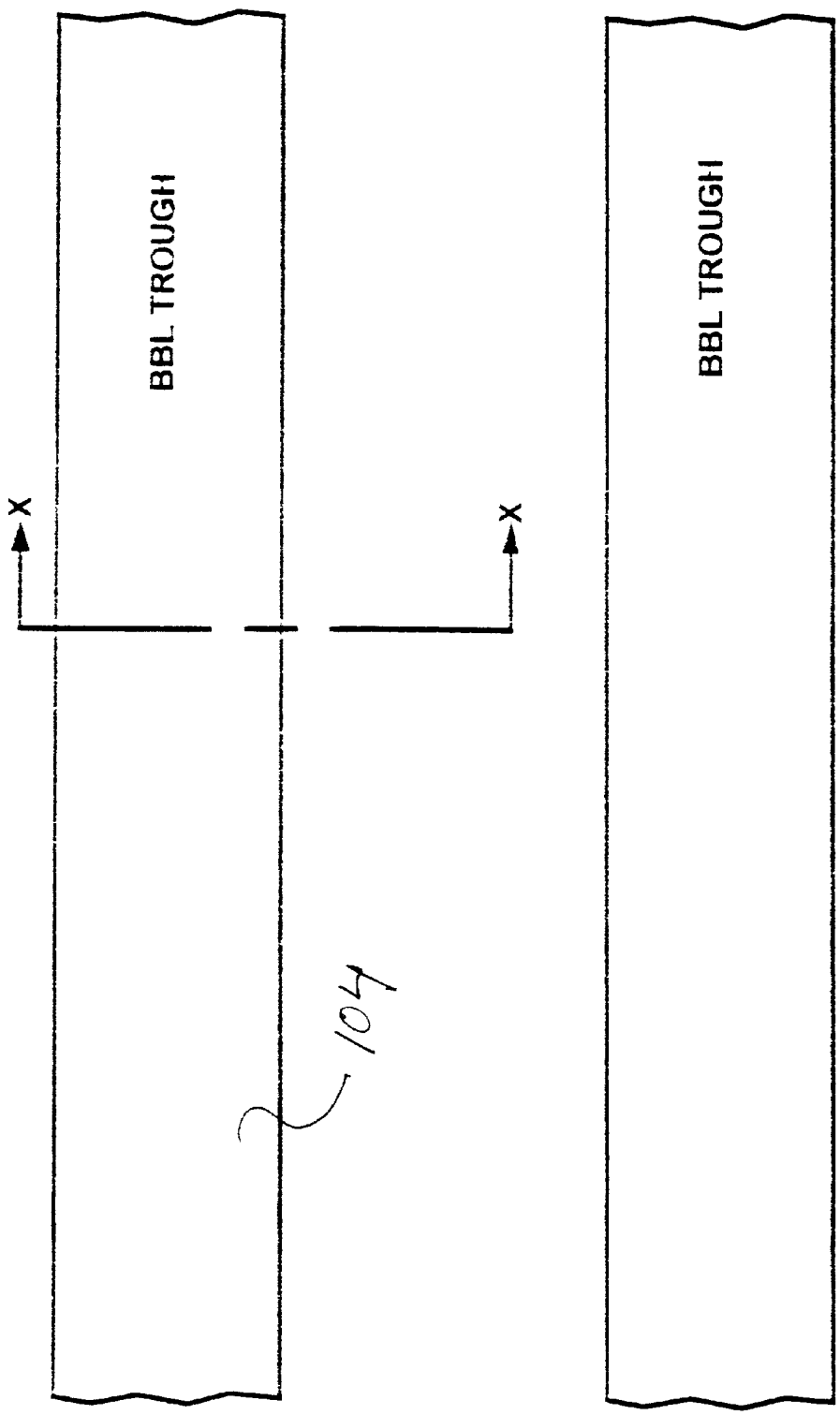
FIG. 2 is a top view of FIG. 1 after troughs are formed in the substrate.

Turning now to FIG. 1, a customary silicon substrate with standard pad layers is shown as the starting point for an embodiment of a process according to the invention. An array region for forming storage cells is shown on the left side, and a support region for forming support circuitry of the array is shown on the right side of FIG. 1 and subsequent Figures. Substrate 100 is typically a P-silicon substrate with a layer of oxide about 5–15 nm (not shown) and a nitride pad 102 about 100–300 nm thick deposited thereon. Other layers that are not relevant to the invention and therefore not shown may also be included. A pattern of lines and spaces is then formed over the surface of the standard pad layers. Troughs 104 are then formed into the semiconductor substrate 100 using the pad layers as a mask. Troughs 104 are typically formed about 1–3 microns deep below the surface of the semiconductor substrate 100. FIG. 2 is a top view of the semiconductor substrate 100 after the troughs 104 have been formed.

Figure 3:
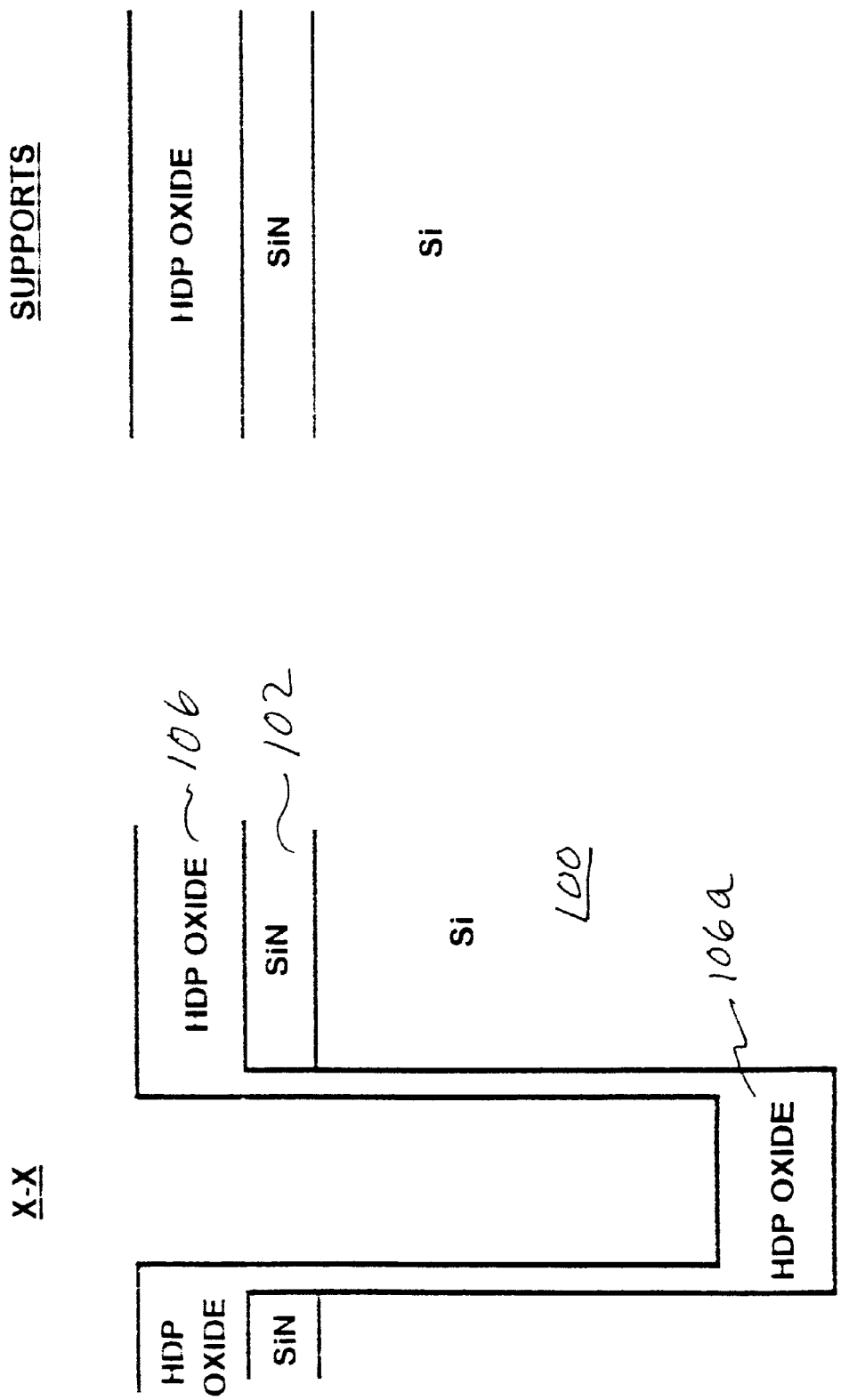
FIG. 3 is a cross sectional view of FIG. 2 taken along line x—x.
Figure 4:
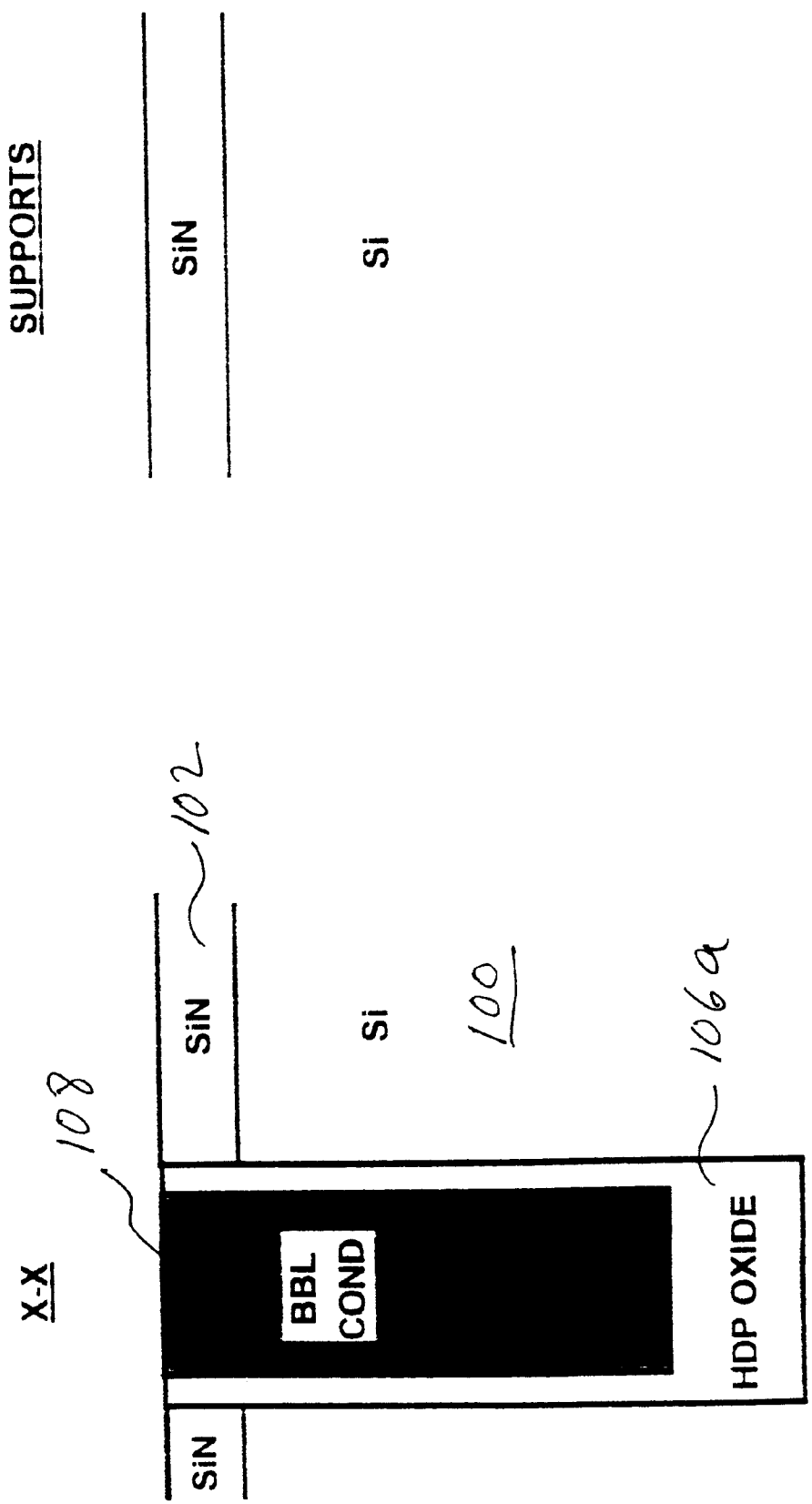
FIG. 4 is a cross sectional view showing a bit line conductor formed in the structure of FIG. 3.

FIG. 3 is a cross-section taken along line x—x of FIG. 2 and shows a dielectric layer 106, preferably of high-density plasma (HDP) oxide, deposited over the surface of pad layers and in the trough 104. The HDP oxide 106 should form substantially thicker on horizontal surfaces than on the vertical sidewalls of the trough 104. A thicker oxide part 106a at the bottom of the trough 104 will provide isolation between the silicon substrate 100 and a bit line, formed later. The thinner HDP oxide formed on the sidewalls allow a strap from the bit line to the silicon substrate, describe below, to be more easily formed. The troughs 104 are then filled with a conductive material 108, preferably N+ polysilicon. A planarization process is then carried out to remove the conductive material 108 from the surface of the HDP oxide 106 and then to remove the HDP oxide 106 from the top surface of the nitride pad 102, resulting in the structure shown in FIG. 4. Standard chemical mechanical polishing or resist planarization and etch back techniques may be used to perform these steps.

Figure 5:
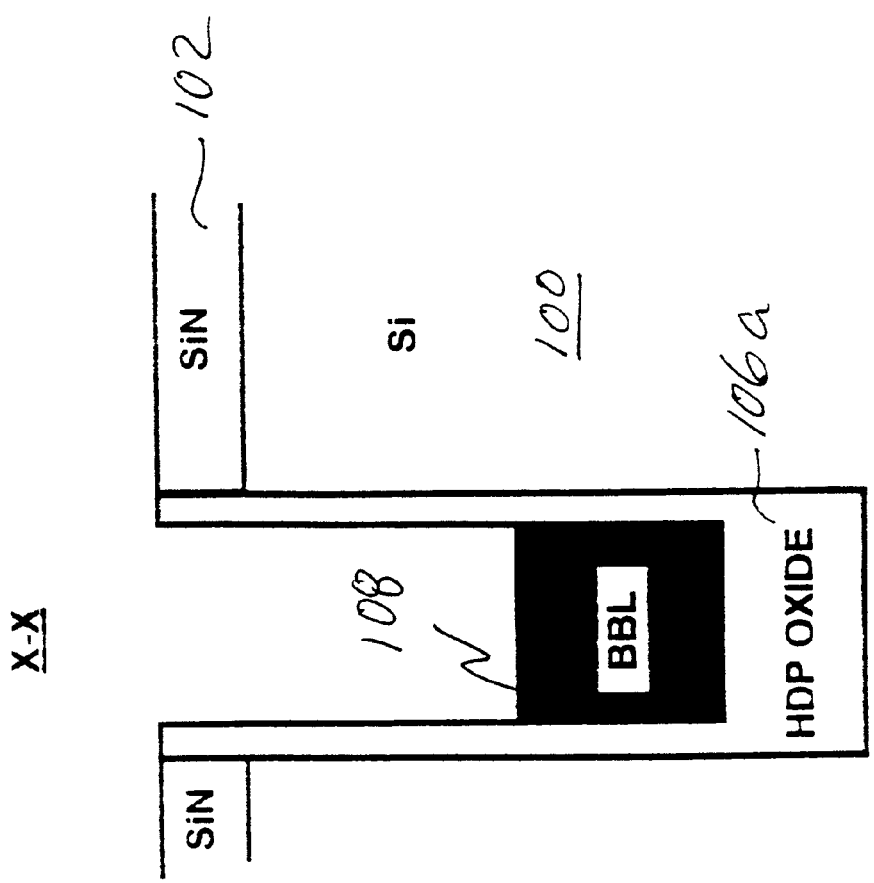
FIG. 5 is a cross sectional view showing the bit line conductor of FIG. 4 after it has been recessed.
Figure 6:
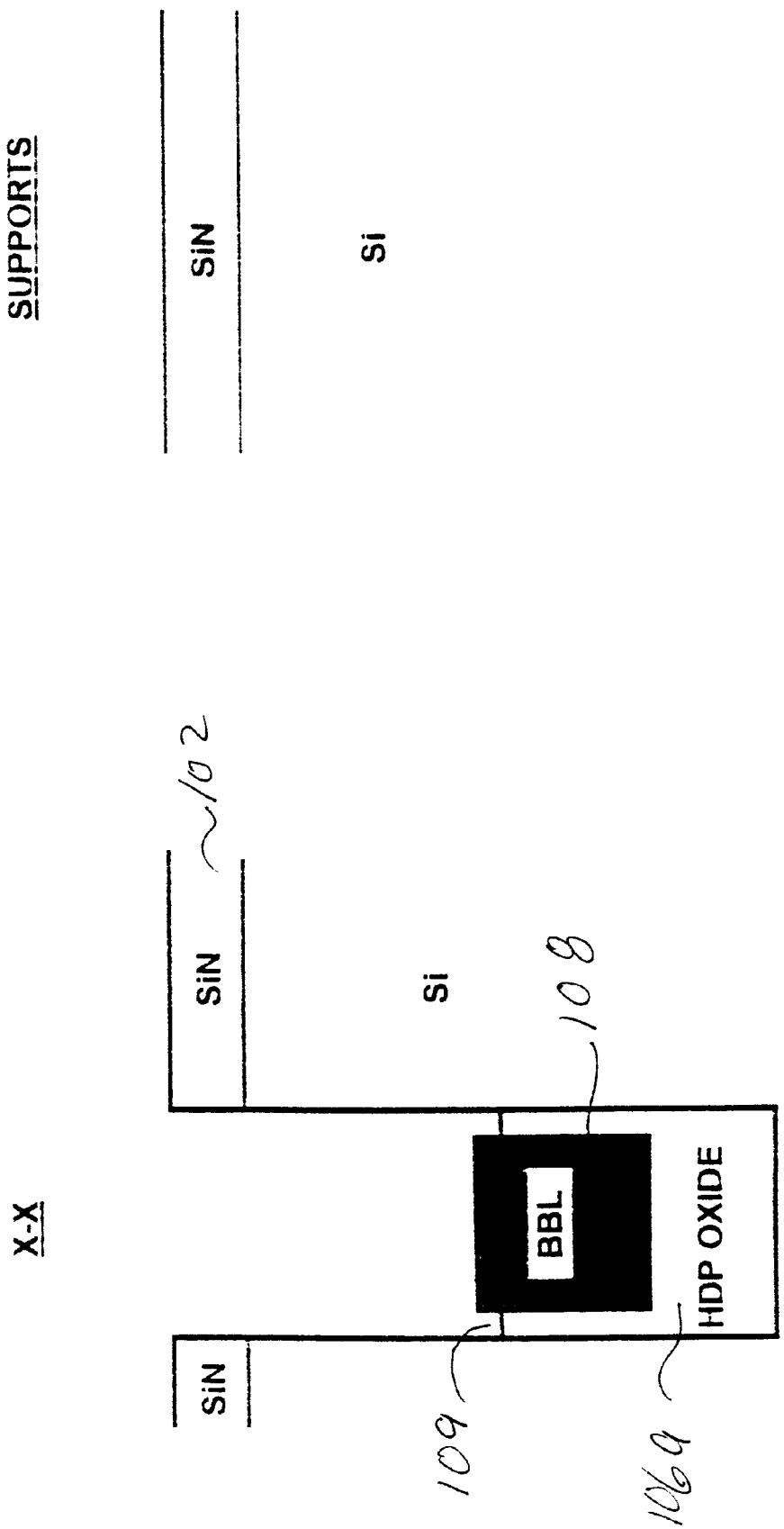
FIG. 6 is a cross sectional view showing the dielectric layer after etching.
Figure 7:
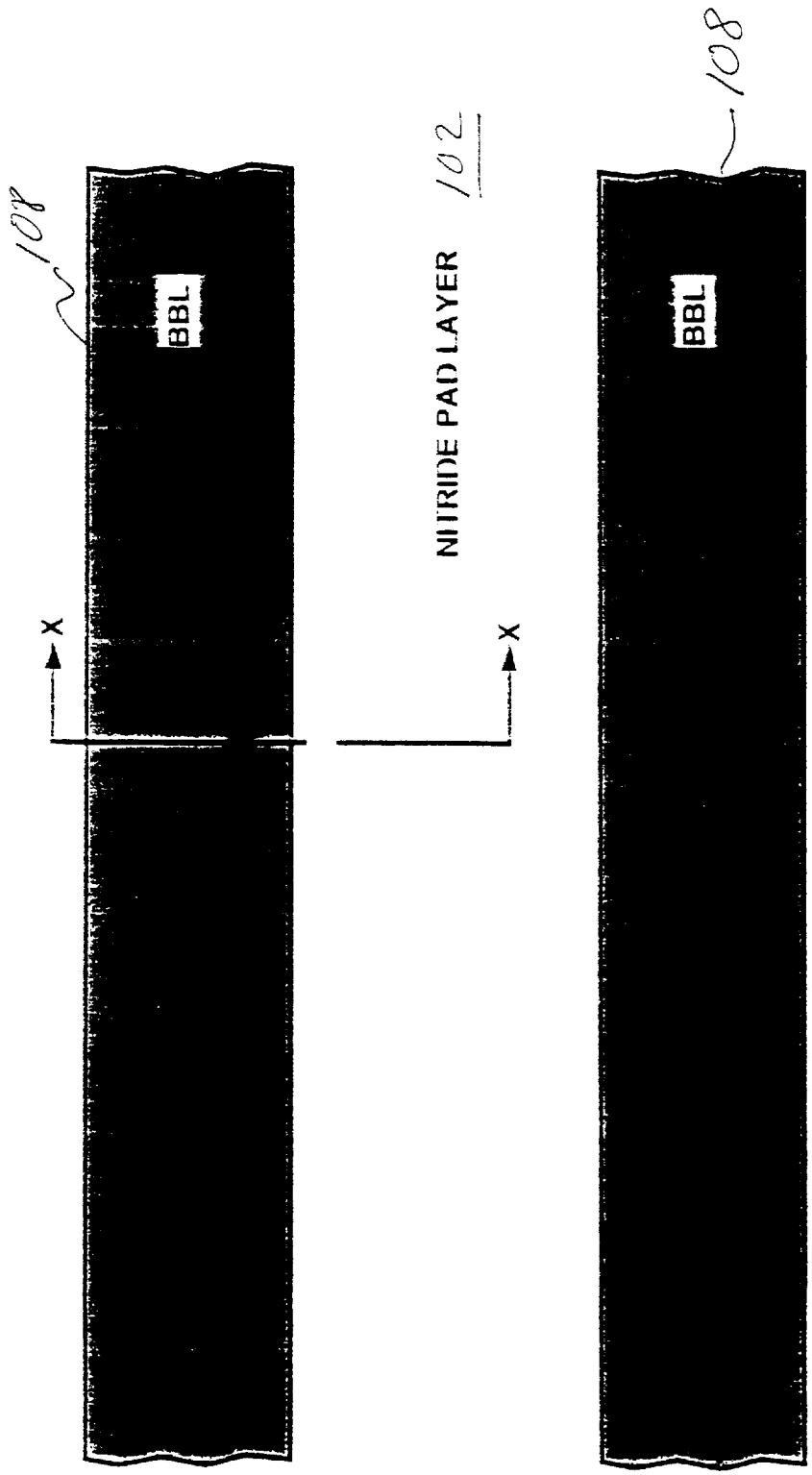
FIG. 7 is a top view of FIG. 6.

Next, as shown in FIG. 5, the conductive material 108 is recessed selectively to oxide and nitride, preferably using an anisotropic etch, to a depth of about 0.5 to 2.5 microns beneath the top surface of the silicon substrate 100. An isotropic etch is then used on the HDP oxide 106 to remove it from the sidewalls of the trough 104, as shown in FIG. 6. The HDP oxide 106 is preferably removed form the sidewalls up to about where the conductive material 108 has been recessed. This isotropic etch may be wet or dry and is selective to nitride and the conductive material 108. The conductive material 108 is now in the form of a bit line. The isotropic etch of the HDP oxide 106 is continued such that divots 109 are formed into the top exposed surface of the HDP oxide 106 as shown in FIG. 6. That is, the HDP oxide 106 is etched until it is recessed beneath the top surface of the bit line conductor 108. The divot 109 is preferably less than 50 nm deep. FIG. 7 shows a top view of the semiconductor substrate 100 illustrating the bit line conductors 108 in the troughs 104. The nitride pad layer 102 is still in place at this point in the process and protects the support regions.

Figure 8:
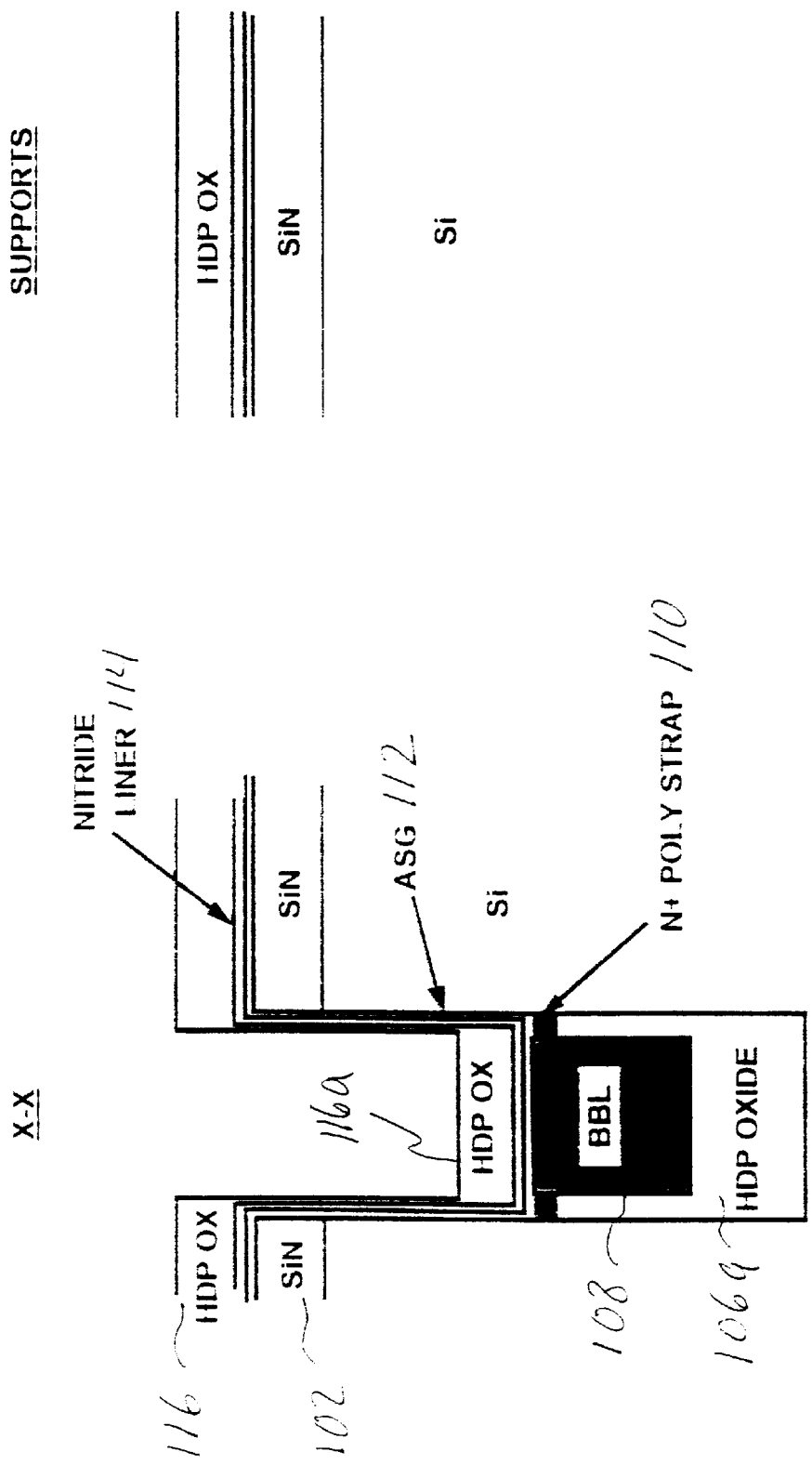
FIG. 8 is a cross sectional view after formation of a strap conductor and a trough top insulator.

A thin layer of polysilicon is deposited over all surfaces and is then isotropically removed. Using a controlled etch, residual polysilicon will remain in the divots 109 formed into the top of the dielectric 106. This forms a conductive strap 110 between the bit line conductor 108 and the silicon substrate 100 as illustrated in FIG. 8. Then, a thin layer 112, about 5–15 nm thick, of doped material, preferably arsenic silicon glass (ASG), is deposited followed by a thin layer 114 of nitride, also about 5–15 nm thick. Another layer of dielectric material 116, preferably also an HDP oxide, is then deposited on top of the nitride layer 114, acting as a diffusion barrier. HDP oxide 116 does not fill the trough 104 and forms thicker on the horizontal surfaces than on vertical surfaces of the device, as shown in FIG. 8. The oxide 116, nitride 114 and ASG 112 are then removed from the sidewalls of the trough 104 above areas where oxide 116 is formed in a thick layer 116a in the bottom of the trough 104. Accordingly, the ASG 112 and nitride layer 114 remain on the trough sidewall in areas adjacent to the thick oxide 116a at the bottom of the trough 104. Thus bit line 108 is enclosed by dielectric material to minimize the capacitance of the bit line to other array structures, providing for better signal development.

A sacrificial oxide may then be grown and stripped to clean the sidewalls of the trough 104. A gate oxide 119 is then grown on the trough sidewall. Gate conductor 120 is then deposited into the trough 104 on top of thick oxide 116a, planarized and recessed to approximately the bottom of the nitride pad 102. This planarization/recess process also removes the gate conductor 120 from the support areas of the device, resulting in the structure shown in FIG. 9. The support regions are still protected by nitride pad layer 102 during the procedures performed in the array region.

Figure 9:
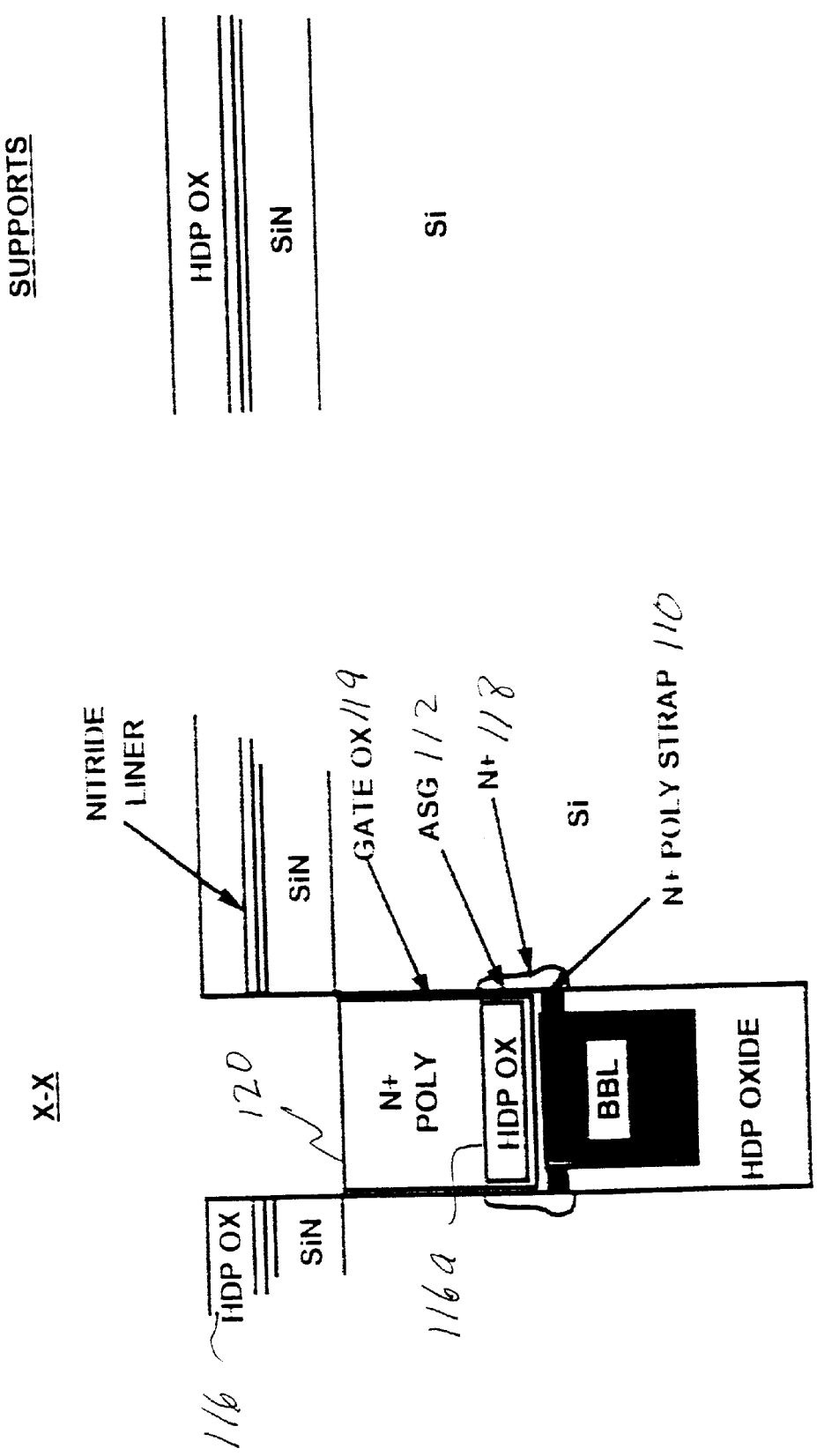
FIG. 9 is a cross sectional view showing a gate conductor formed on the trough top insulator.

As shown in FIG. 9, during the oxidation steps, n-type impurities out diffuse from the bit line conductor 108 and the strap 110 into the silicon substrate 100. The concentration of the diffused ions may be quite high, for example, $5 \times 10^{19}$ or greater and form a source/drain diffusion 118. Doping concentrations this high in the source/drain diffusion region 118 that are too close to the edge of the gate conductor 120 may result in a leakage problem. Therefore, ASG (arsenic silicon glass) 112, which is typically lower doped than bit line 108, has been provided.

Source/drain diffusion 118 further comprises out-diffusion from the ASG 112. Ions from the ASG 112 between the thick oxide 116a and the sidewall of the trough out-diffuse into substrate 100 at a lower concentration than ions from bit line 108. This provides a lower doping concentration in the source/drain diffusion at the edge of the gate conductor 120. Additionally, ASG 112 ensures overlap of the source/drain region 118 with the gate conductor 120 in the event that the oxide 116a is formed too thick and, consequently, gate conductor 120 is formed too far from the strap 110. The out-diffusion of ions adjacent the out-diffusion through strap 110 from the ASG 112 forms an equivalent of a source/drain extension of source/drain diffusion 118 in a vertical transistor. Thus, as shown in FIG. 9, source/drain diffusion 118 is larger in areas closer to bit line 108, while the source/drain extension is smaller in areas closer to gate conductor 120.

Figure 10:
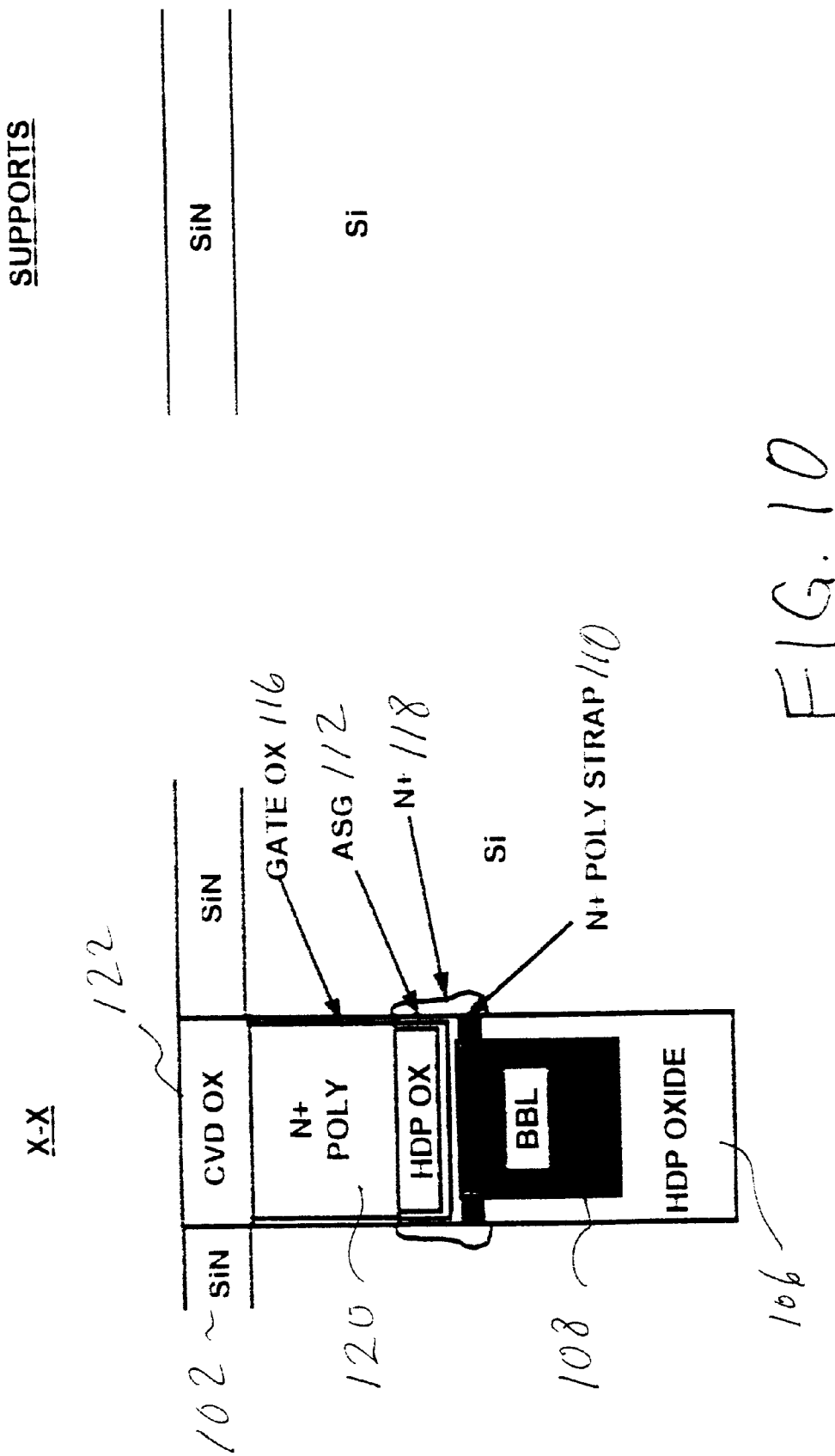
FIG. 10 is a cross sectional view showing an insulating cap formed over the gate conductor.
Figure 11:
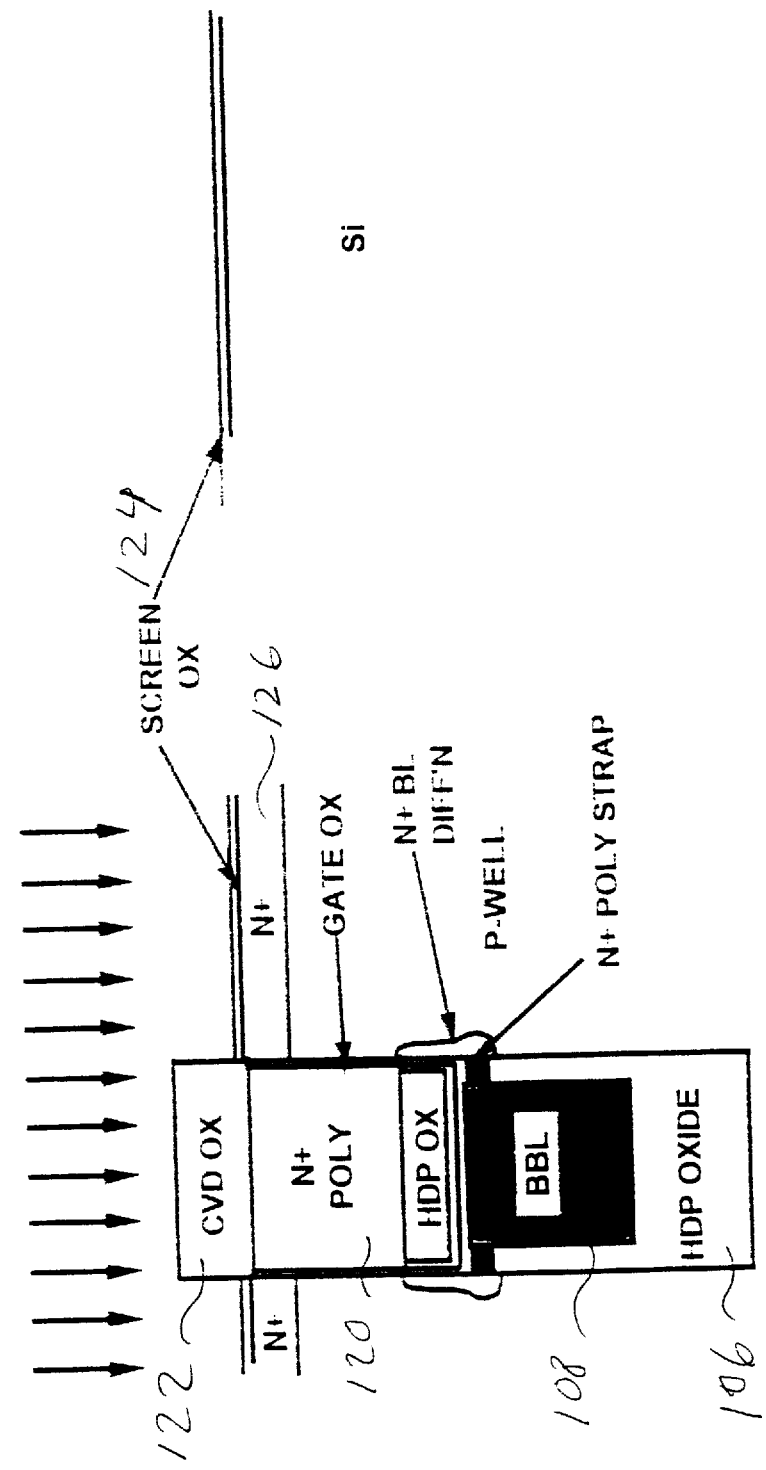
FIG. 11 is a cross sectional view showing the implantation of diffusion regions.
Figure 12:
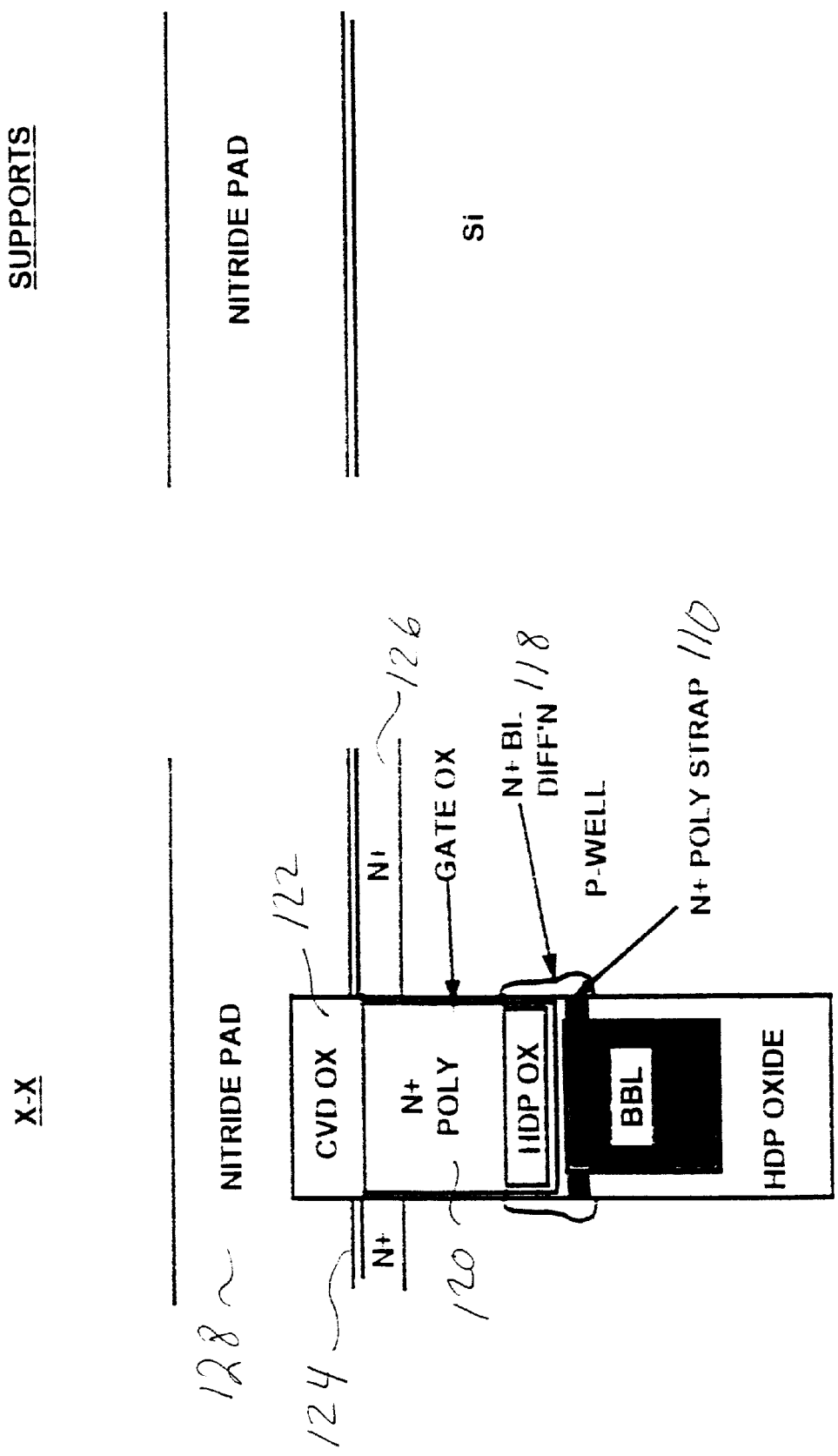
FIG. 12 is a cross sectional view showing a nitride pad layer over the semiconductor surface.

FIG. 10 illustrates an insulating cap 122, preferably a layer of oxide 122, formed cap over the gate conductor 120. This maybe done, for example, using chemical vapor deposition. Insulating cap 122 is planarized to the top surface of the nitride pad 102. This planarization process also removes oxide 116, ASG 112, and nitride 114 from the top surface of the substrate 100. Nitride pad 102 is then removed selective to oxide and silicon, preferably using either an RIE process or wet or dry isotropic etch. The nitride pad 102 is removed in both the array region and in the support region. A screen oxide 124 is then grown on the exposed silicon surfaces. Next, node diffusions 126 and p-wells are implanted in the array region, as shown in FIG. 11. During these processes, the support region is protected by a block mask (not shown). A new nitride pad layer 128 is then deposited and if necessary, planarized, as shown in FIG. 12. The nitride pad layer 128 is used to form shallow trough isolation (STI).

Figure 13:
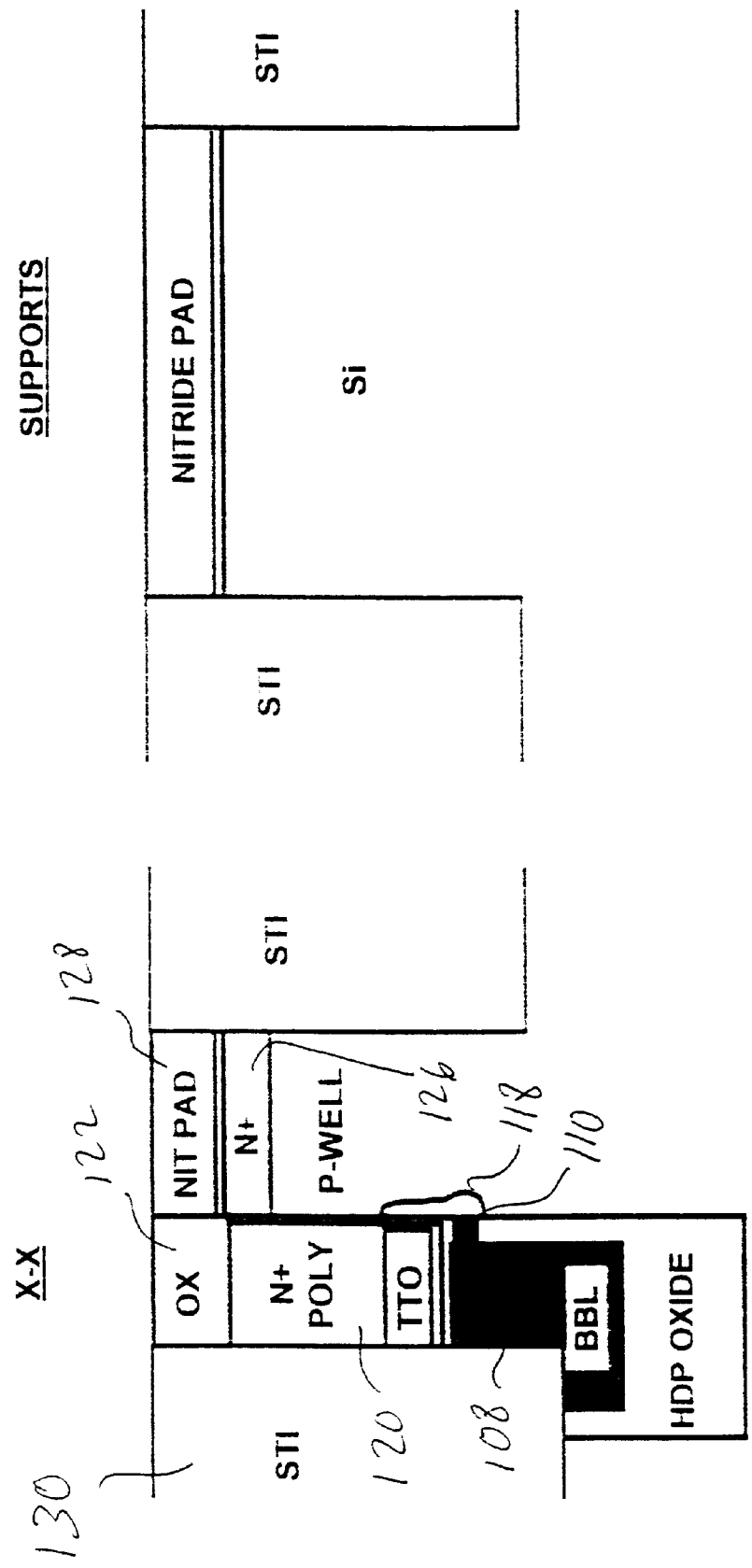
FIG. 13 is a cross sectional view showing the formation of isolation structures.
Figure 16:
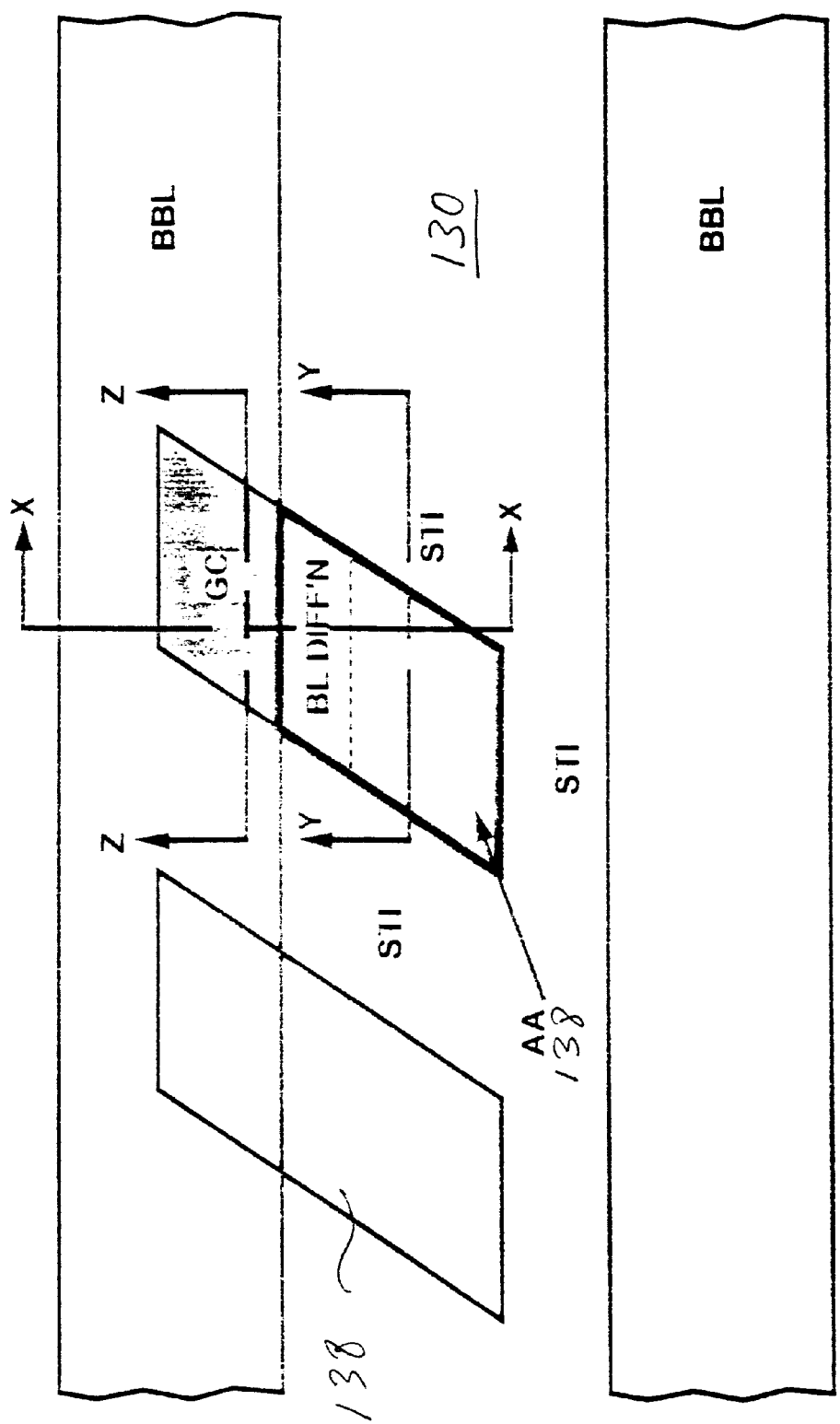
FIG. 16 is a top or plan view of FIG. 15.

An active region mask, shown in FIG. 16, is used to pattern the STI regions into -nitride pad layer 128. Then, troughs are etched into the various underlying silicon, polysilicon and oxide layers. Using processes which are well known in the art, the shallow troughes 130 are filled with CVD or HDP oxide and planarized. The planarization process, which may include a combination of CMP and RIE, results in the top surface of the remaining portion of the nitride pad 128, the top surface of the STI region 130 and the top surface of the oxide cap 122 all being coplanar, as shown in FIG. 13. Also as shown in FIG. 13, forming STI region 130 removes one sidewall of the trough, including the strap conductor 110 and the source/drain diffusion 118 on one side of the trough 104. Consequently, the bit line 108 is connected to one sidewall of the trough and one transistor is formed. The transistor includes source/drain diffusion 118, gate conductor 120, and node diffusion 126. A channel for charge carriers, formed when the gate conductor 120 is elevated to a voltage above threshold, extends in a straight line along the sidewall of the trough 104 between the node diffusion 126 and source/drain diffusion 118.

Figure 14:
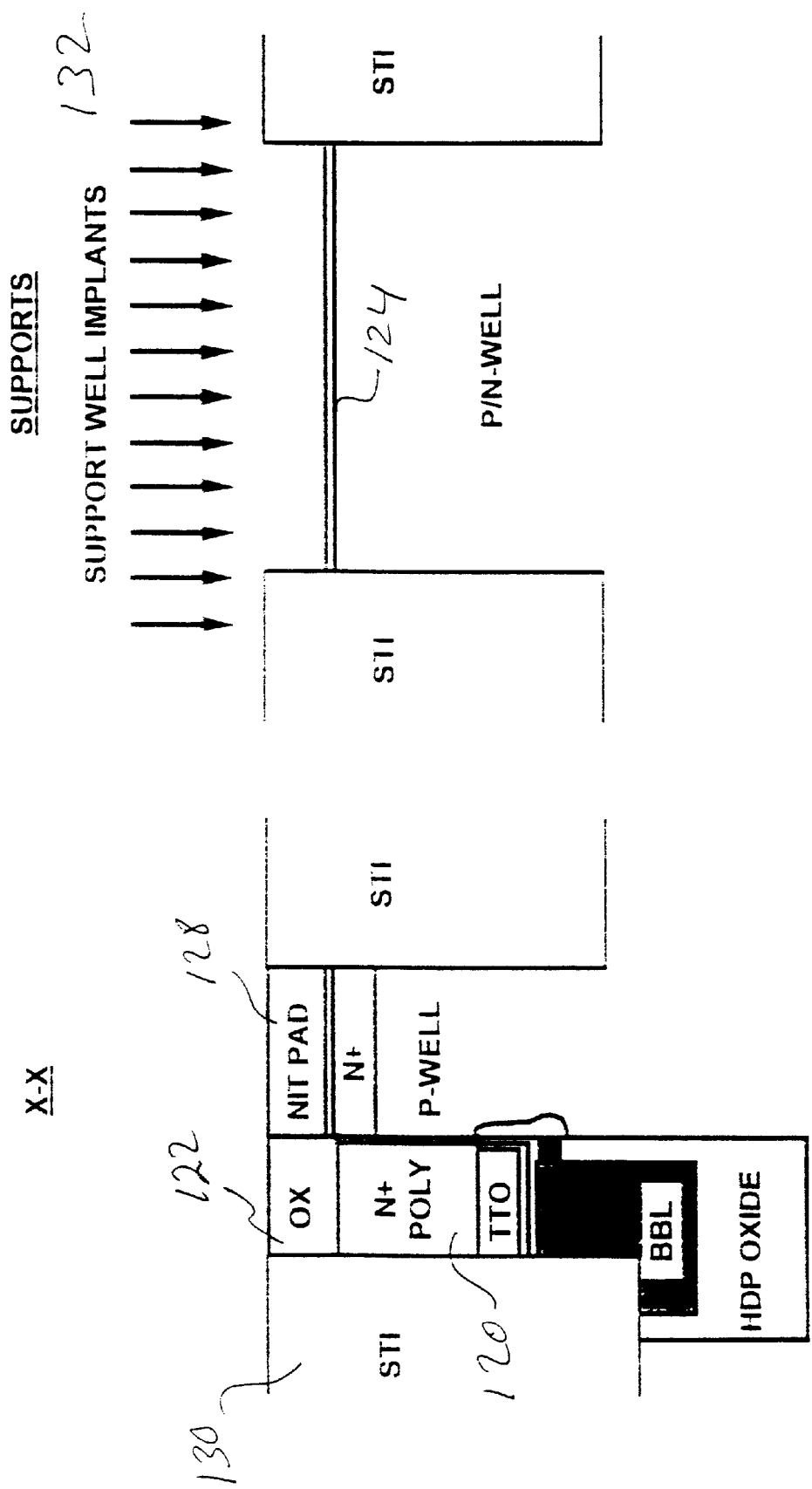
FIG. 14 is a cross sectional view showing the implantation of wells in the support region.
Figure 15:
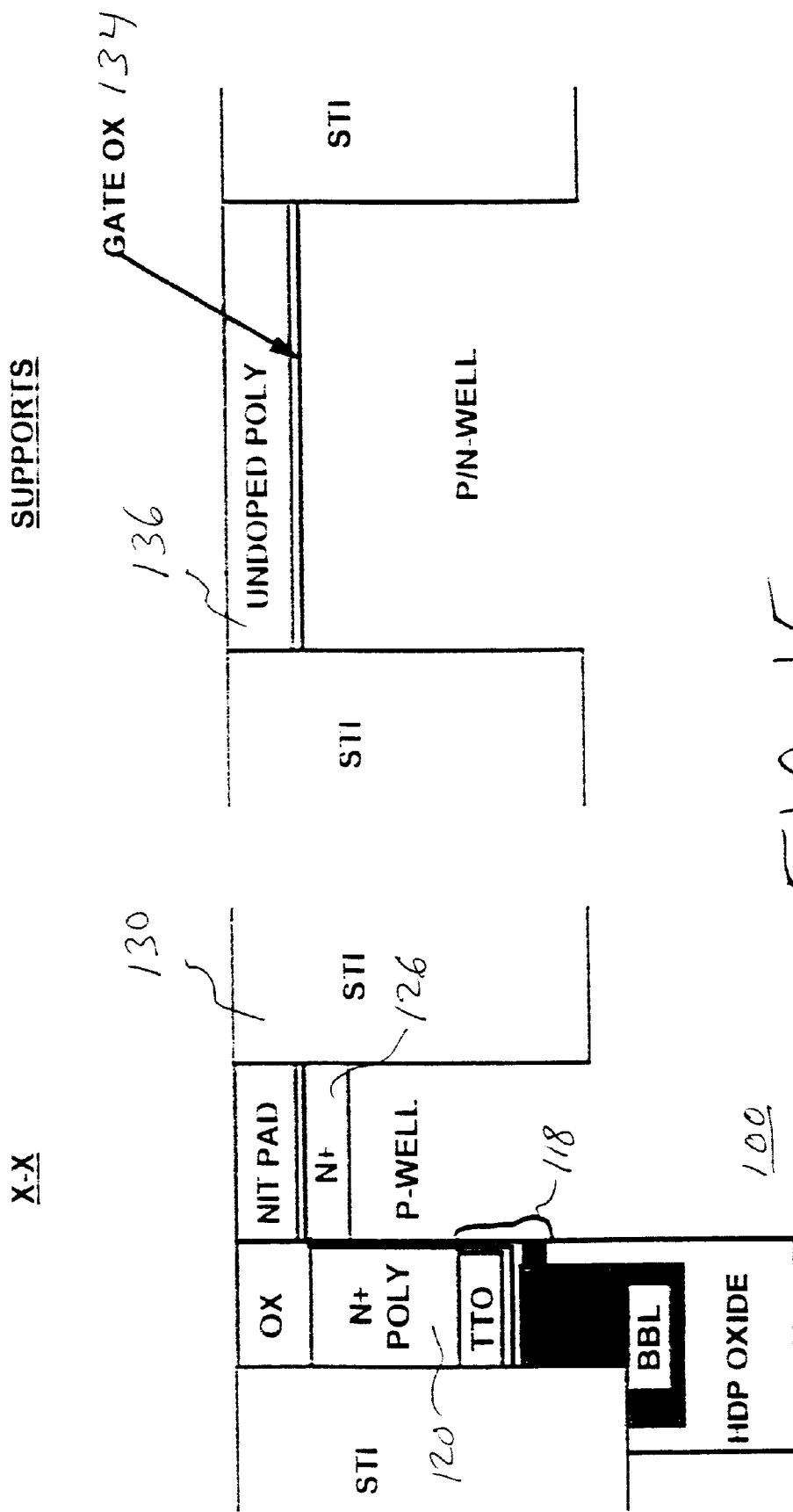
FIG. 15 is a cross sectional view showing a gate oxide and polysilicon formed in the support regions.

FIGS. 14 and 15 show processing steps carried out in the support region. In FIG. 14, nwell and p-well implants are made into the support region. A block mask, not shown, protects the array region and the nitride pad 128 is removed from the support regions, selective to the underlying screen oxide 124. Next, the block mask is stripped and the wells in the support region are then implanted, while the array region remains protected by the pad nitride 128, cap oxide 122 and STI regions 130. If additional protection for the array region is desired, the block mask used to protect the array region when removing the nitride pad 128 from the support may be kept in place. Screen oxide 124 is then stripped from the support regions, preferably with a blanket oxide etch which is selective to nitride and silicon. During this operation, a small amount of oxide may also be removed from the top of the STI region 130 and cap oxide 122. The removal of this small amount of oxide is acceptable. Next, support gate oxide 134 is grown on the exposed substrate in the support region. A layer of undoped polysilicon 136 is deposited on the support regions and planarized such that its top surface is coplanar with the top surface of STI regions 130 as shown in FIG. 15.

According to the present invention, a mask is used for forming active regions that are rhomboid in shape when viewed from a plan view. The top surface areas of the active regions provide contact areas which will later be used to form capacitor contacts. FIG. 16 shows a top or plan view of the array region at the same point in the process as FIG. 15. From this view it can be seen that the shape of active regions 138 is rhomboid when viewed from above. An advantage of the rhomboid shape is that the active regions can be extended between word lines, formed later, so as to allow increased area for capacitor contacts to be reliably made while still allowing a word line pitch enabling a cell size substantially less than 8 $F^2$. In a preferred embodiment, the word line pitch is substantially equal to 2 F, enabling a storage cell area substantially equal to 5 $F^2$. The increased surface area available for the capacitor contact results in decreased contact resistance and improved signal development.

STI regions 130 are formed in the semiconductor substrate to define the active regions. Transistors including source/drain diffusion 118, gate conductor 120, and node diffusion 126 are formed in the active regions. As STI region 130 overlaps one side of trough 104, one transistor is formed per active region 138. The active regions are those portions of the semiconductor substrate 100 that remain between STI regions 130. Active regions 138 are preferably isolated from each other on all sides by STI regions 130.

Additionally, as shown in FIG. 15, a body of the transistor is formed from the p-well implanted into the silicon defined by the active regions. The bit line is preferably a single sided bit line that is offset to one side of active region 138. A continuity path circumventing the source/drain diffusion 118 exists, connecting the body of the transistor with the substrate . Consequently, the body of the transistor is not floating and remains directly connected to semiconductor substrate 100 via the active region.

Figure 17:
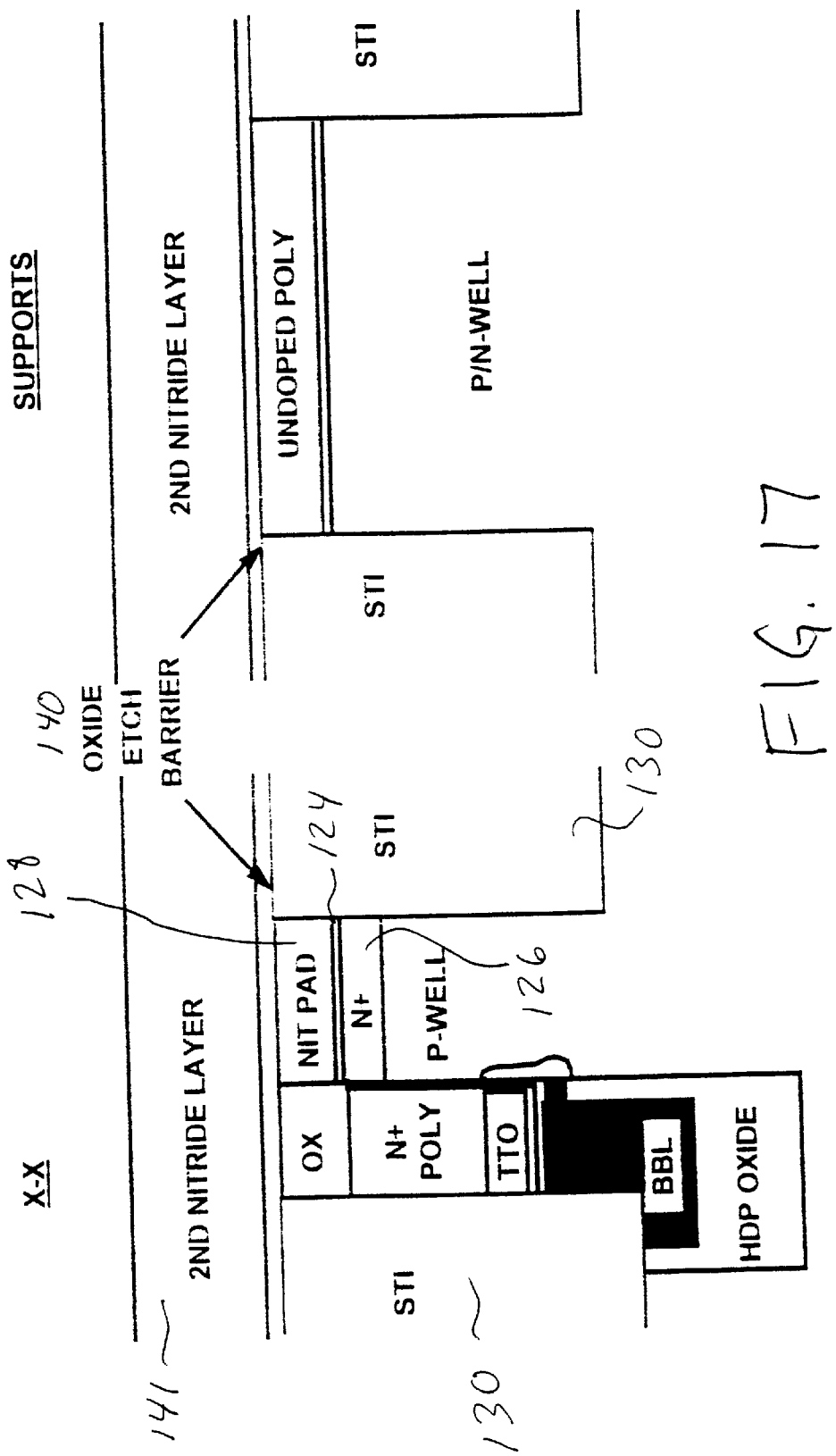
FIG. 17 is a cross sectional view showing the formation of a nitride layer over the surface of the semiconductor substrate.

Next, word lines are formed. As noted above, a word line pitch substantially equal to 2 F, concurrently with a relatively large capacitor contact area, is enabled by the rhomboid shape of the surface areas of the active regions 138. An etch barrier, preferably a thin layer 140 of oxide, or other suitable material, is formed on the surface of the structure as shown in FIG. 17. Subsequently, a second layer of nitride 141 is deposited on oxide layer 140. The second layer of nitride should have a thickness of about 100–400 nm. These layers serve as a mandrel for forming the word lines. Grooves are then etched into the second nitride layer 141, substantially orthogonal to the bit lines 108. This etching is carried out selective to oxide such that the oxide layer 140 acts as an etch stop. After the etch reaches the oxide layer 140, the exposed oxide 140 is etched selective to silicon and polysilicon to remove the exposed oxide 140 inside the grooves formed in nitride 141. The etching is then continued into the oxide cap 122 and STI regions 130. The etching should continue until the oxide cap 122 is completely removed in areas where word lines are to be formed. Then, sidewall spacers 142 are formed on the vertical edges on the exposed pad nitride 128 and on the second nitride layer 141 and on the remaining insulating cap 122. A low resistivity material 144, such as tungsten silicide, is deposited in the grooves formed in the second nitride layer 141, planarized and then recessed beneath a top surface of the second nitride layer 141. The low resistivity material 144 forms the word lines. An insulating layer 146, such as oxide, is then deposited in the grooves on top of the low resistivity material 144 and is planarized to the top surface of the second nitride 141, resulting in the structure shown in FIG. 18. Thus, a word line formed of low resistivity material 144 contacts the gate conductor 120.

Figure 18:
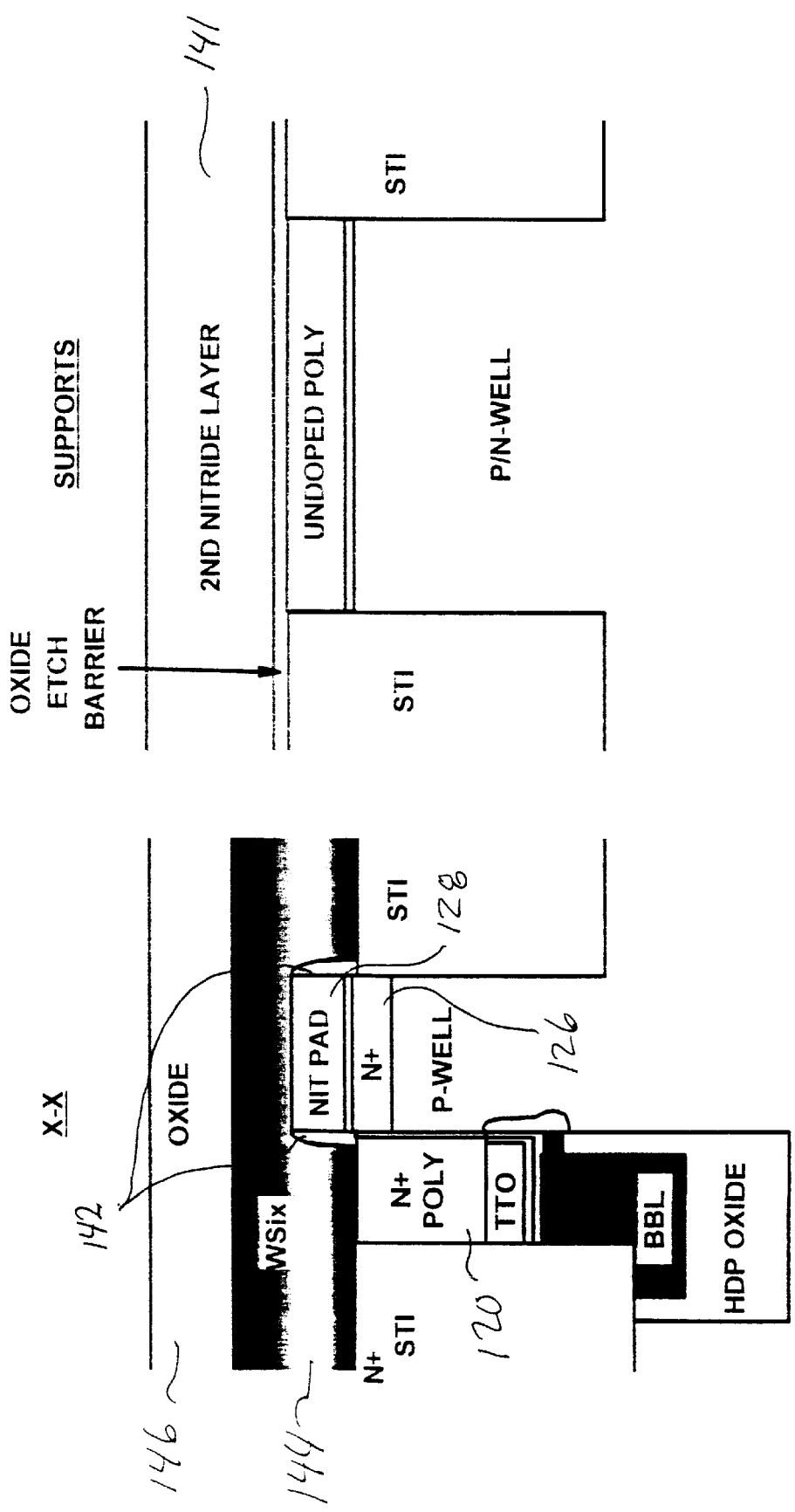
FIG. 18 is a cross sectional view showing word lines formed in the nitride layer.
Figure 19:
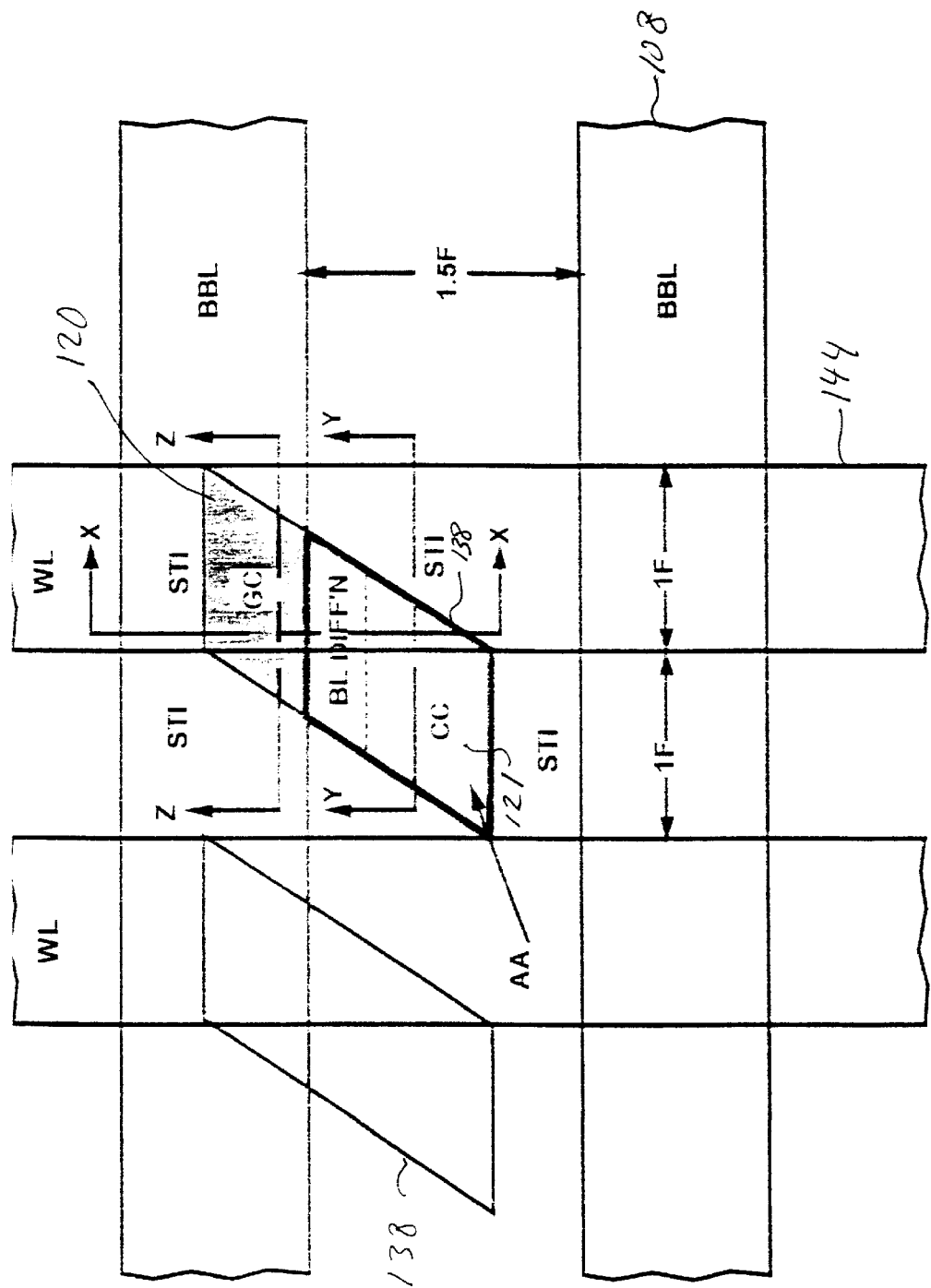
FIG. 19 is a top view of FIG. 18.

The word lines and bit lines are formed substantially orthogonal to each other as shown in FIG. 19, which is a top view at the same point in the process as FIG. 18. Lying under the intersection of the word lines and bit lines is the area of the gate conductor 120 which contacts the word line 144. A portion of the remaining area 121 of the active region 138 will be used as a landing pad for a capacitor contact. The rhomboid shape of the contact area of the active region enables the remaining area 121 to be sufficiently sized to allow a reliable contact to be formed.

Figure 20:
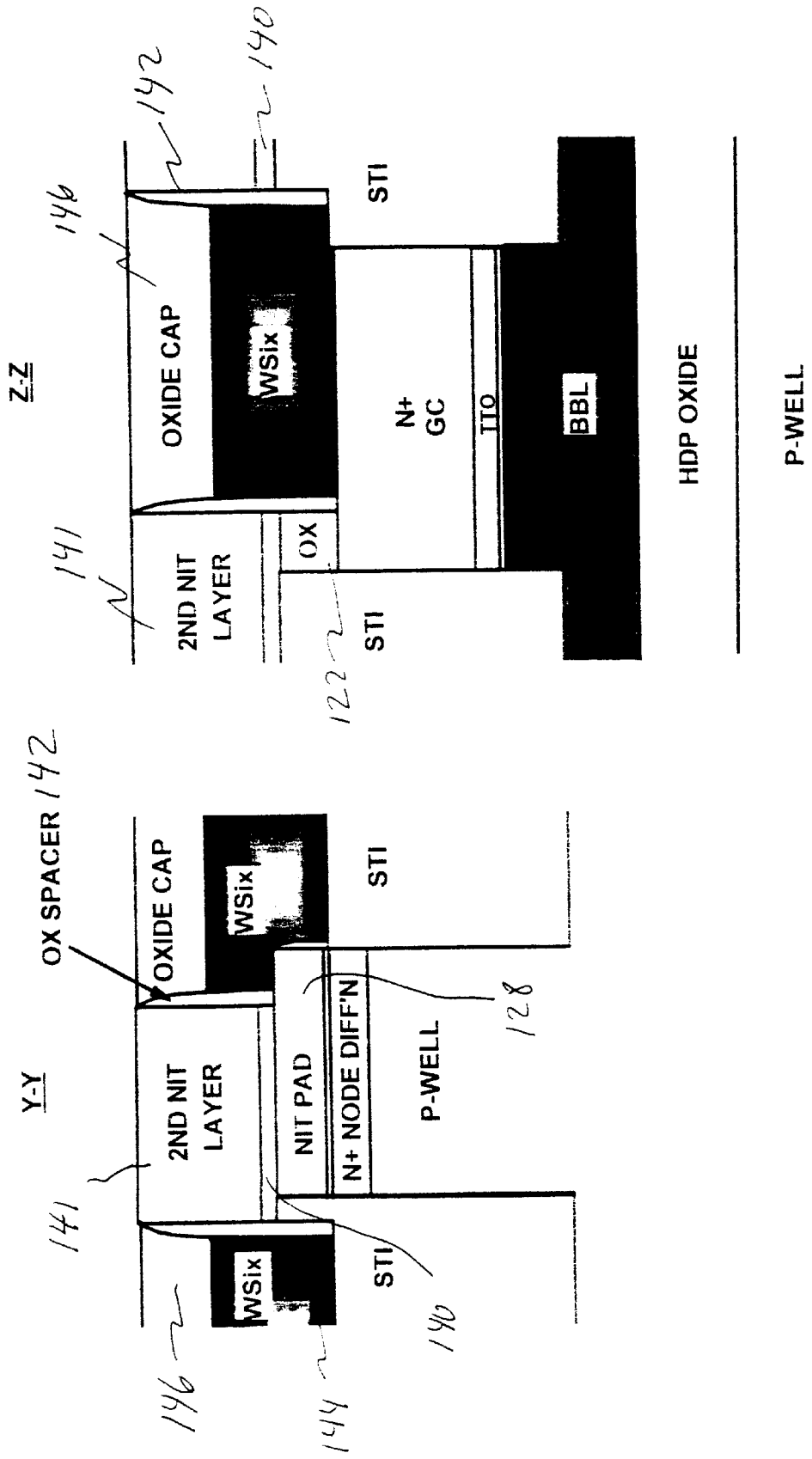
FIG. 20 shows cross sectional cuts through lines y—y and z—z of FIG. 19.

FIG. 20 shows cross sectional cuts through lines y—y and z—z of FIG. 19 corresponding to the same point in the process that is shown in FIG. 18. As shown in FIG. 20, the second nitride layer 141 remains in areas outside of the word lines, that is the second nitride layer 141 was only removed where the word lines were to be formed. In other areas, second nitride layer 141 serves as a placeholder for contacts to a capacitor, formed later. Also note that a small portion of oxide cap 122 remains adjacent to the word line 144.

Figure 21:
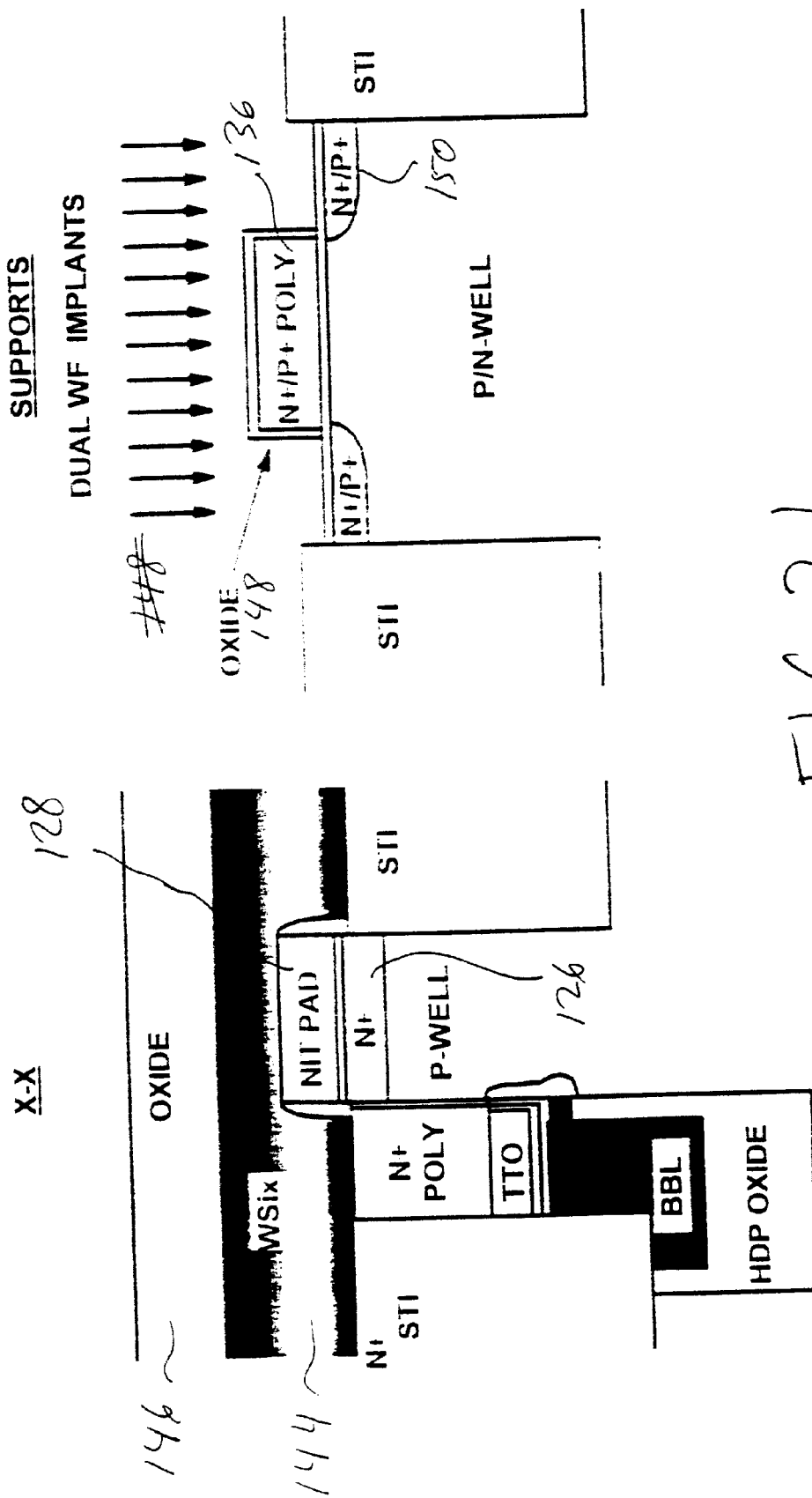
FIG. 21 is a cross sectional view showing the formation of a transistor in the support regions.

The second nitride layer 141 is then removed from the entire surface of the device, including the support regions, selective to oxide. Removing second nitride layer 141 to oxide layer 140 above original pad nitride layer 128 forms holes in the array region where second nitride layer 141 serves as a placeholder for contacts to a capacitor. This also exposes the undoped polysilicon 136 in the support regions. Polysilicon 136 is then patterned and etched to form a gate conductor. A gate sidewall 148 oxide is grown and dual work function implants are performed. The array region is masked by the remaining original pad nitride layer 128 and overlying oxide layer 140 over the node diffusion 126. This implantation defines the dual work function doping in the support MOSFET gate conductors and their source/drain diffusions 150 as shown in FIG. 21.

Figure 22:
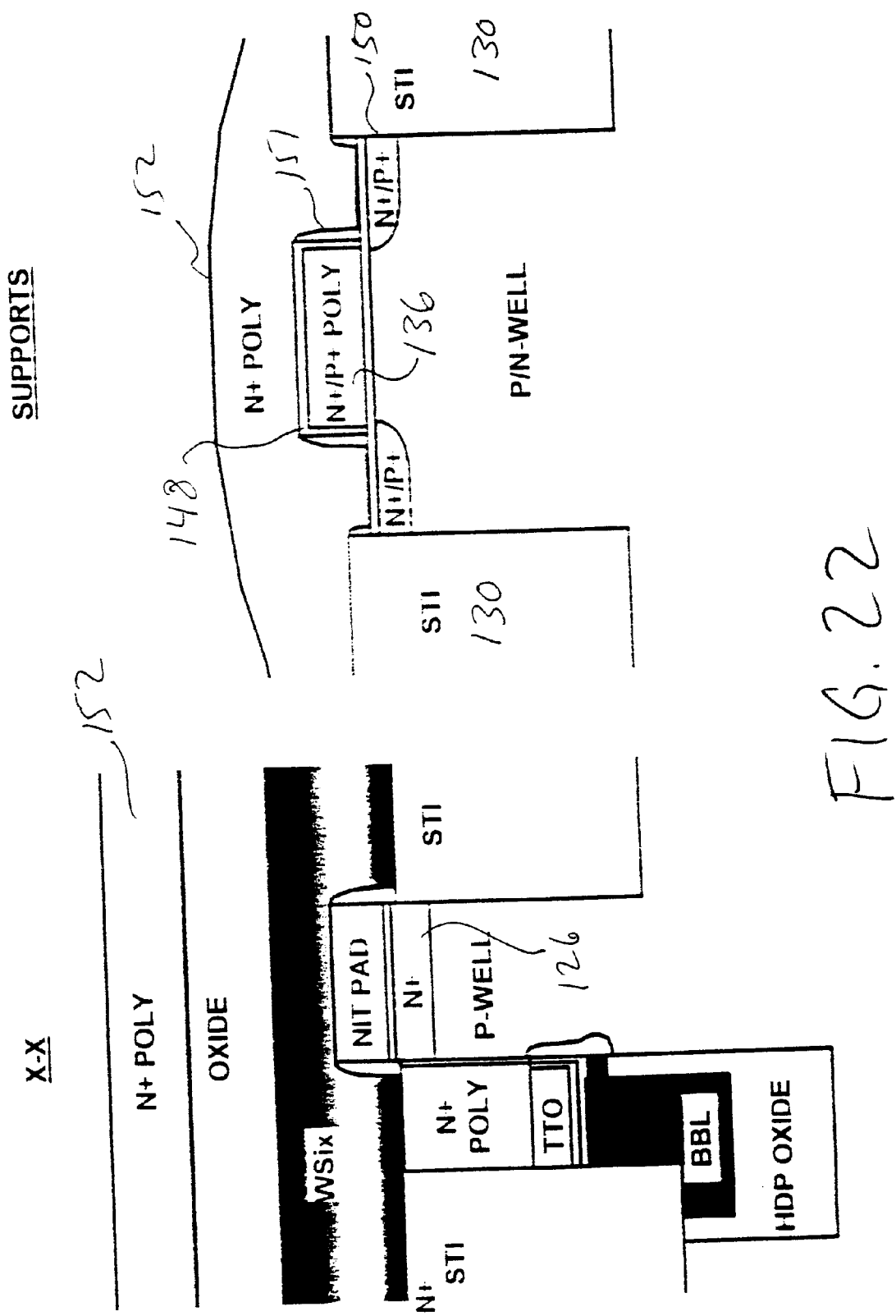
FIG. 22 is a cross sectional view showing a layer of polysilicon formed over the semiconductor substrate.
Figure 23:
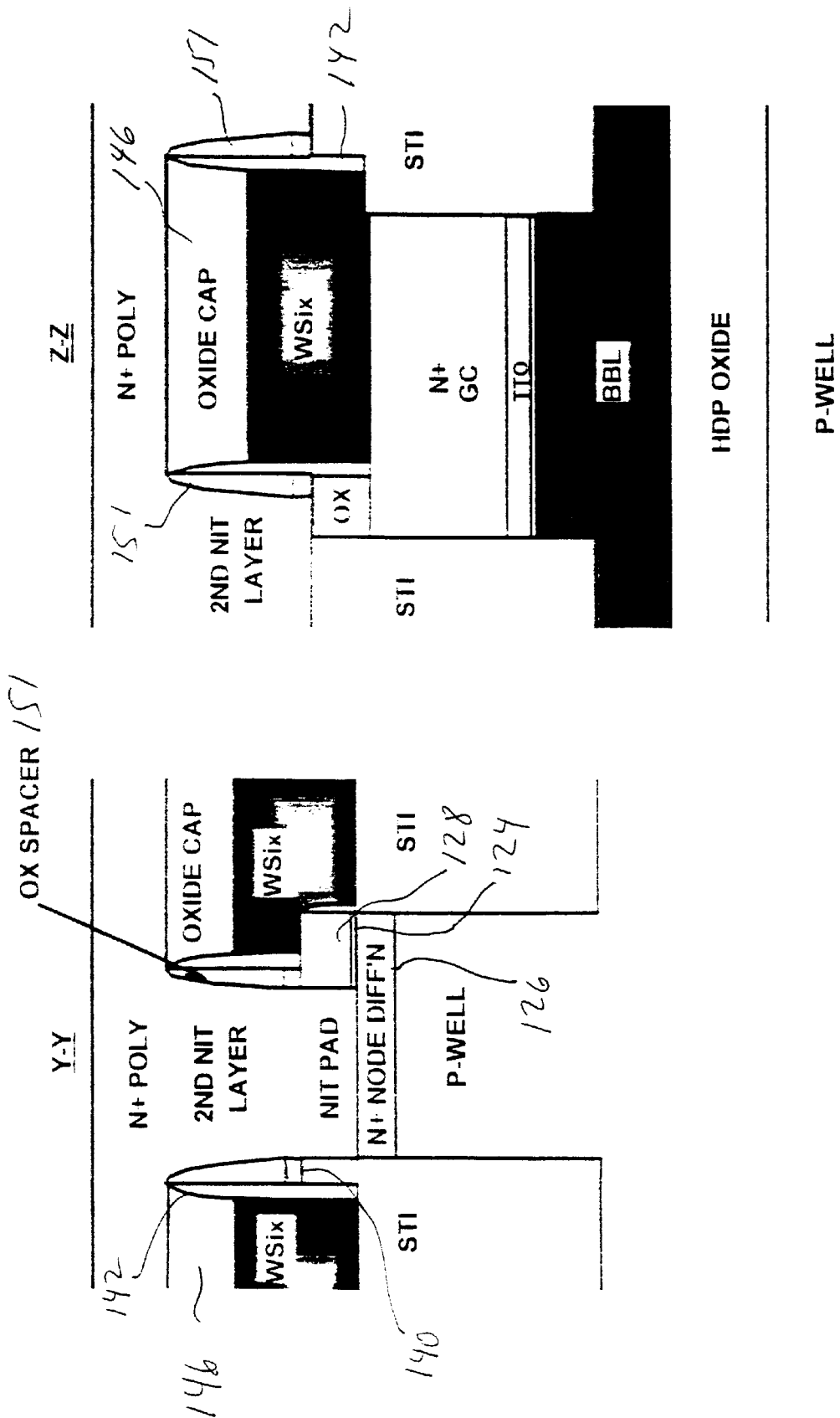
FIG. 23 is a cross sectional view taken along lines y—y and z—z at the same point in the process as shown in FIG. 22.

Following the dual work function implant in the support regions, insulating spacers 151 are formed on all exposed vertical sidewalls, as shown in FIG. 22. This includes the gate conductors 136 in the supports, STI regions 130, and any remaining pad nitride layers, and also on the oxide spacers 142 previously formed, as seen in FIG. 23. Next, the thin oxide 140 and original nitride layers 128 over the node diffusion 126 are removed to expose the node diffusion 126. A block mask is preferably used to protect the oxide layers 148 formed over the gate conductor 136 and the source/drain diffusion 150 formed in the support regions. The protective block mask in the supports is then removed. Note that small portions of thin oxide 140 and original nitride layers 128 remain under spacers 151.

Contacts for the capacitor to node diffusion 126 may now be formed. Along those lines, as shown in FIG. 22, a layer of N+ polysilicon 152 is then deposited over the surface of the device. FIG. 23 shows cross sections at lines y—y and z—z at the same point in the process as is shown in FIG. 22.

Figure 24:
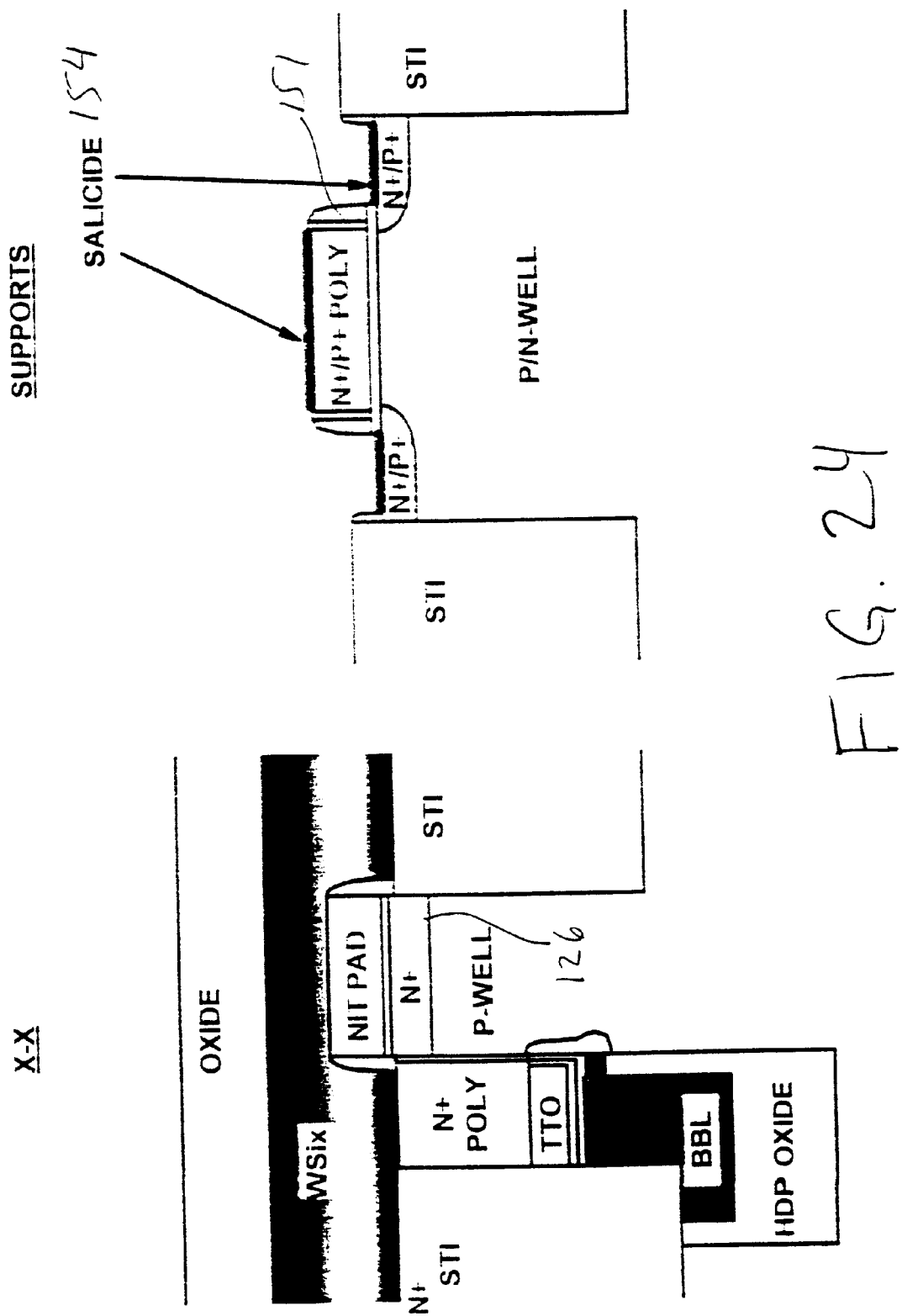
FIG. 24 is a cross sectional view after the polysilicon has been selectively recessed and salicide has been deposited.
Figure 25:
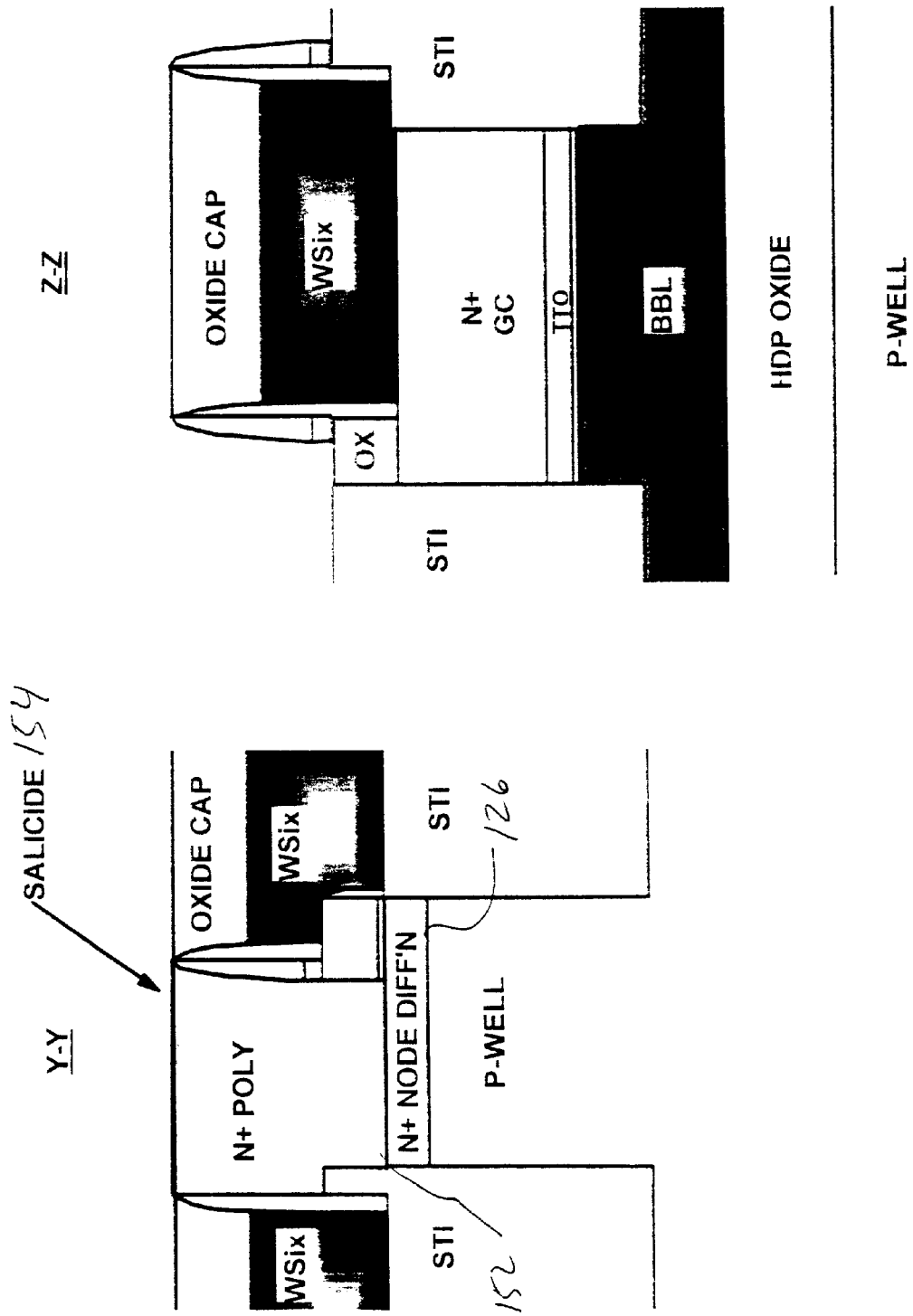
FIG. 25 is cross sectional views taken along lines y—y and z—z at the same point in the process as shown in FIG. 24.
Figure 28:
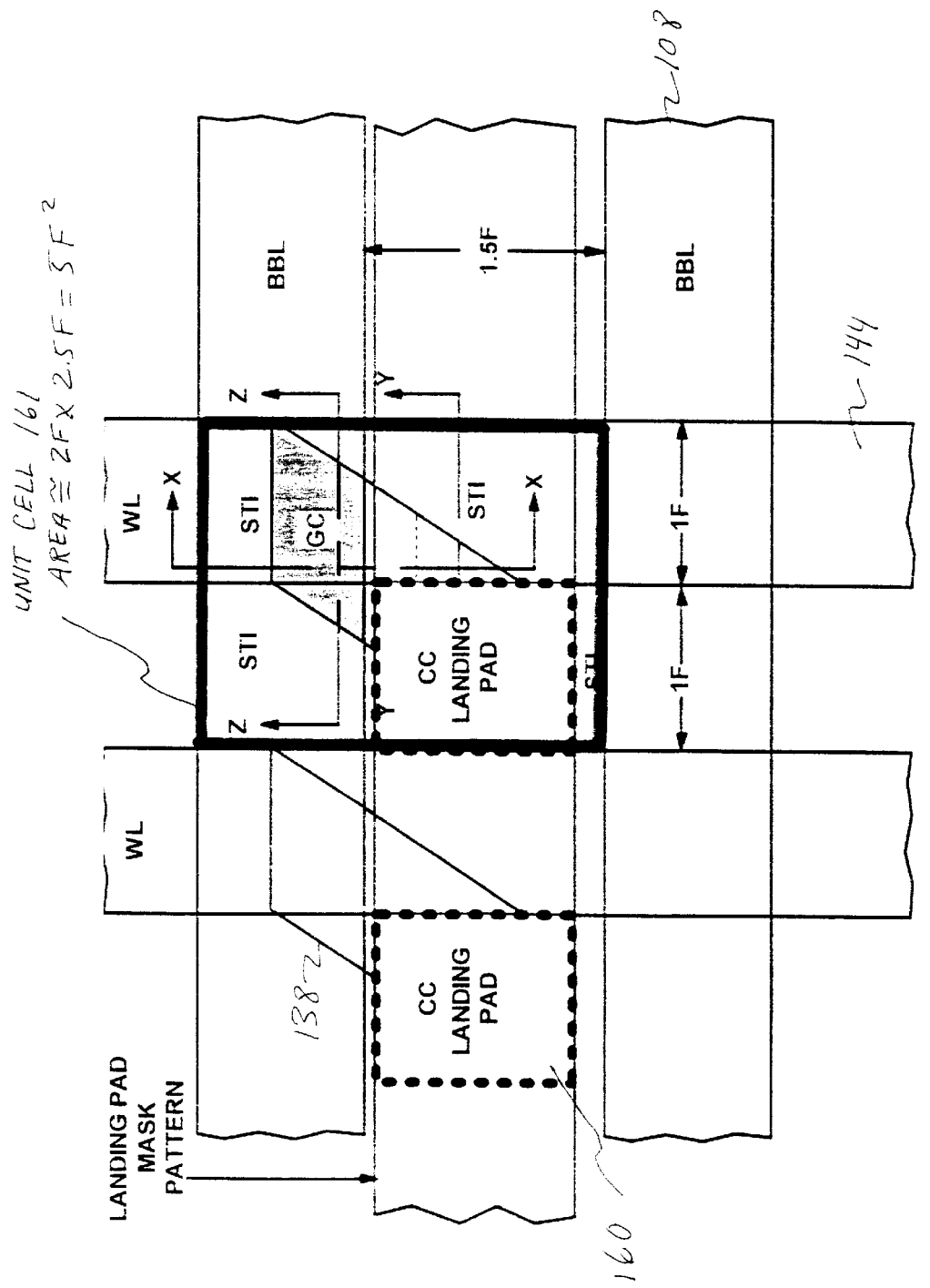
FIG. 28 is a top or plan view showing a layout of the capacitor contact landing pad.

The N+ polysilicon 152 is planarized and recessed selective to oxide such that its top surface is below the top surface of the insulating cap 146. A capacitor contact landing pad mask, shown in FIG. 28, is then used to pattern the N+polysilicon 152 in the array region and to remove the polysilicon 152 completely from the support region. Thus, polysilicon 152 remains in areas of the array region between the word lines, where second nitride layer 141 was previously. Oxide 148 over the source/drain diffusions 150 and gate 136 in the support region is then removed and all exposed silicon and polysilicon are salicided as shown in FIG. 24, providing for low resistance and consequently higher performance. FIG. 25 is a cross section at lines y—y and z—z at the same point in the process as shown in FIG. 24. It can be seen here that polysilicon 152 remains in the opening over the node diffusion 126. The surface of polysilicon 152 is also covered with salicide 154 to further reduce the series resistance associated with the capacitor contact, for better performance of the array transistors.

FIG. 28 shows a top or plan view of the capacitor contact areas (CC landing pad) 160. From FIG. 28 it can be seen that the rhomboid shape of the active regions 138 provides sufficient area for the capacitor contacts to be reliably made, while allowing the word lines 144 to be spaced close together enough to realize a compact cell area substantially equal to 5 F² for unit storage capacitor cell 161. In a preferred embodiment, a word line pitch substantially equal to 2 F and a bit line pitch substantially equal to 2.5 F are enabled, allowing a storage cell 161, preferably embodied as a stacked capacitor, to have an area substantially equal to 5 F².

According to the invention, the process of forming the compact cell area is simplified because only a mask (see "Landing Pad Mask Pattern" in FIG. 28) comprising horizontal stripes is needed to form the capacitor contact areas 160. The capacitor contact mask comprises horizontal stripes which define the pattern used to cut N+polysilicon 152 after it is polished to the top surface of insulating cap 146. A mask to cut the capacitor contacts vertically is not needed because they are vertically cut by the word lines 144 by being polished down to the top of the word line conductors.

Figure 26:
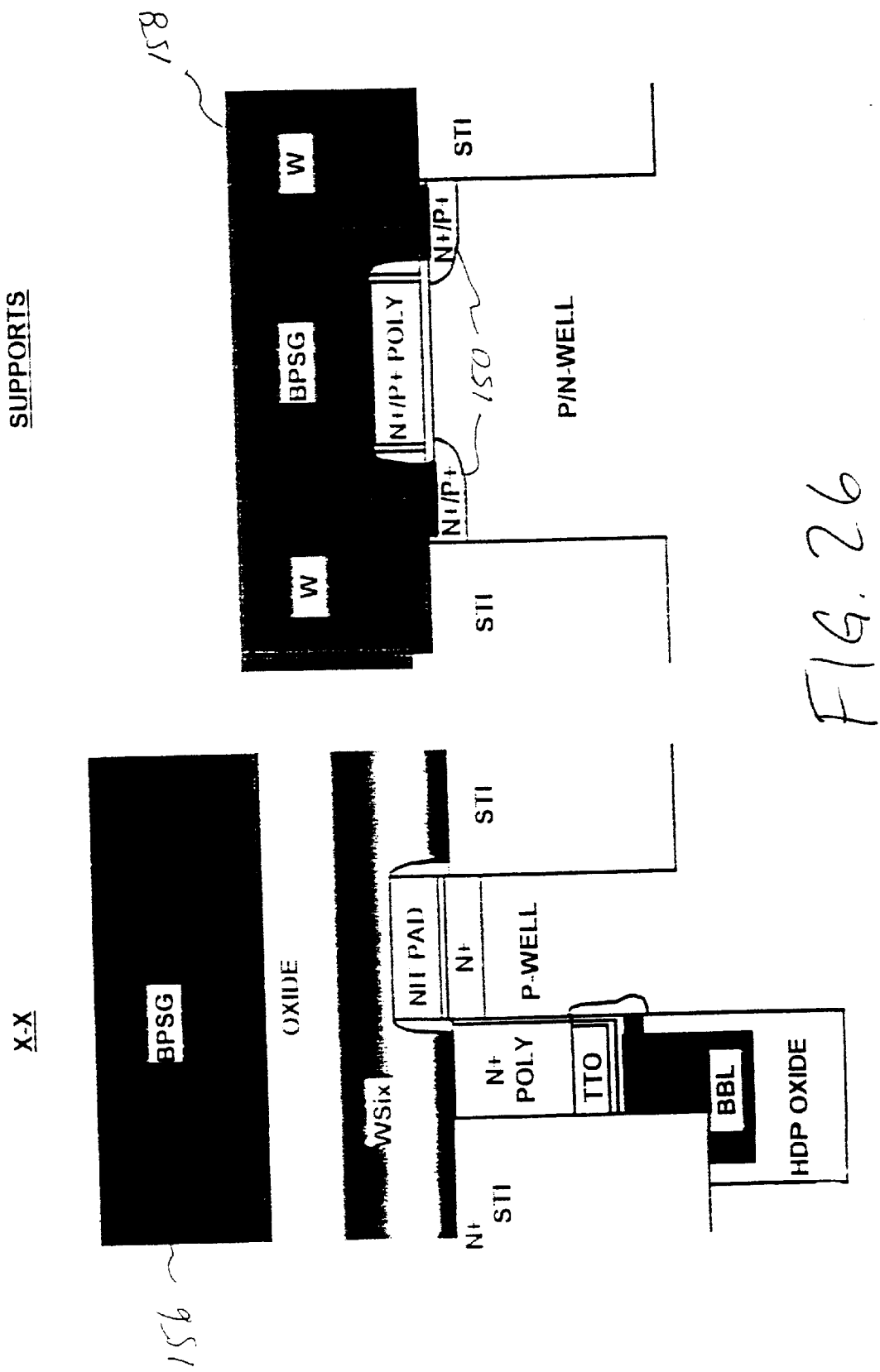
FIG. 26 is a cross sectional view showing a layer of dielectric material with vias etched therein.
Figure 27:
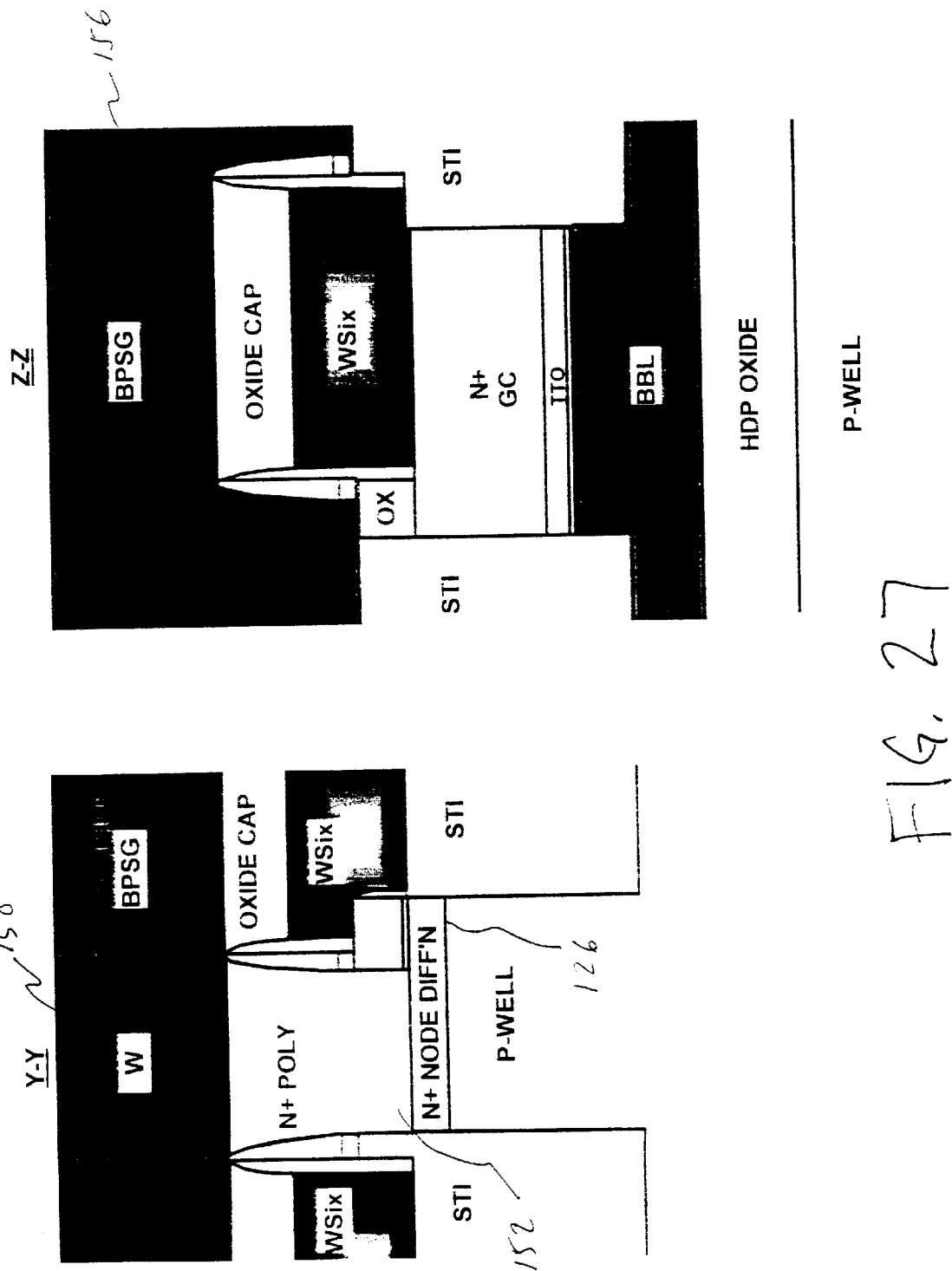
FIG. 27 shows cross sectional views taken along the lines y—y and z—z at the same point in the process as shown in FIG. 26.

A layer of insulating material 156, such as BPSG or other suitable passivating interlevel dielectric material, is deposited over the surface of the device. An etch stop layer may optionally be deposited prior to formation of insulating layer 156. Vias are then etched into layer 156 and a conductive material 158 such as tungsten is deposited in the vias and planarized to the top of the layer 156. As shown in FIGS. 26 and 27, the vias are arranged to contact the source/drain diffusions 150 in the support region and to contact the N+polysilicon 152 and consequently the node diffusion 126 in the array region. The connective material on the capacitor contact landing pad in the array region serves as an interconnect to the stacked capacitor, which may now be formed above the surface of the semiconductor surface using standard processing techniques.

While a preferred embodiment of the invention has been described above, since variations in the invention will be apparent to those skilled in the art, the invention should not be construed as limited to the specific embodiment described above. For example the specific order of the processes performed and the materials describe above may be varied without departing from the scope of the invention.

What is claimed is:

1. A semiconductor device comprising:
   a semiconductor substrate;
   a trough formed in the substrate;
   a bit line buried in the trough and surrounded by a dielectric material;
   a buried strap connecting the bit line to the substrate;
   a trough top dielectric formed in the trough above the bit line;
   a dopant rich source provided between the trough top dielectric and the bit line;
   source/drain diffusion formed in the substrate adjacent to the buried strap;
   an extension of the source/drain diffusion being formed by out-diffusion of dopants from the dopant rich source into the substrate;
   a gate conductor formed in the trough over the trough top dielectric;
   a node diffusion formed at a surface of the substrate, the node diffusion, the source/drain diffusion and the gate conductor forming a transistor, a channel of the transistor extending in a straight line from the node diffusion to the source/drain diffusion; and
   a contact area within a rhomboid shape active region connected to said node diffusion for providing a contact for a stacked capacitor.

2. The semiconductor device of claim 1 further comprising a stacked capacitor formed above a surface of the substrate and connected to said rhomboid shaped active region.

3. The semiconductor device of claim 1 wherein a body of the transistor is connected to the substrate.

4. The semiconductor device of claim 1 wherein the bit line is completely surrounded by the dielectric material, except for the connection to the strap.

5. The semiconductor device of claim 1 wherein the extension has a lower doping concentration than the source/drain diffusion.

* * * * *